(12) United States Patent
Sumiyoshi

(10) Patent No.: US 7,403,262 B2
(45) Date of Patent: Jul. 22, 2008

(54) PROJECTION OPTICAL SYSTEM AND EXPOSURE APPARATUS HAVING THE SAME

(75) Inventor: Yuhei Sumiyoshi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 300 days.

(21) Appl. No.: 11/282,418

(22) Filed: Nov. 17, 2005

(65) Prior Publication Data

US 2006/0126048 A1    Jun. 15, 2006

(30) Foreign Application Priority Data

Nov. 18, 2004    (JP)    ............................. 2004-335192

(51) Int. Cl.
G03B 27/42    (2006.01)
G03B 27/54    (2006.01)

(52) U.S. Cl. .............................. 355/53; 355/67; 355/71; 378/34; 378/35

(58) Field of Classification Search .................. 355/53, 355/67, 71; 378/34, 35
See application file for complete search history.

(56) References Cited

U.S. PATENT DOCUMENTS 5,729,331 A    3/1998    Tanaka et al.
2006/0126048 A1*    6/2006    Sumiyoshi .................. 355/67

FOREIGN PATENT DOCUMENTS

JP    2004-022708    1/2004

* cited by examiner

Primary Examiner—Della J. Rutledge
(74) Attorney, Agent, or Firm—Morgan & Finnegan, LLP

(57) ABSTRACT

A projection optical system used for an exposure apparatus to projecting a reduced size of an image of an object onto an image plane includes plural refractive elements that dispense with a reflective element having a substantial optical power, wherein the projection optical system forms an intermediate image.

16 Claims, 15 Drawing Sheets

PROJECTION OPTICAL SYSTEM AND EXPOSURE APPARATUS HAVING THE SAME

BACKGROUND OF THE INVENTION

The present invention relates generally to a projection optical system in an exposure apparatus, and more particularly to a projection optical system in an exposure apparatus used to manufacture a semiconductor integrated circuit and a liquid crystal display.

The exposure apparatus, such as a stepper and a scanner, used to manufacture a semiconductor device, such as an IC and LSI, is demanded to have an improved resolving power as the fine processing to the semiconductor device advances.

In general, the Rayleigh's formula gives the resolving power of the exposure apparatus, where R is a resolvable critical dimension, k1 is a constant determined by the photosensitive agent (resist) and illumination condition, $\lambda$ is an exposure wavelength, and NA is a numerical aperture:

$$R = k1 \cdot \lambda/NA \quad (1)$$

NA is defined as follows, where n is a refractive index of an image side, and $\theta$ is an angle between the optical axis and the marginal ray:

$$NA = n \cdot \sin\theta \quad (2)$$

The depth of focus ("DOF") is expressed as follows, where k2 is a constant:

$$DOF = k2 \cdot n \cdot \lambda/(NA^2) \quad (3)$$

Therefore, according to Equation (1), use of a shorter exposure wavelength and a higher NA of the projection optical system are effective to the improved resolving power of the exposure apparatus.

The use of a shorter exposure wavelength has been promoted by adopting the ultra high-pressure mercury lamp (having a wavelength of 365 nm), a KrF excimer laser (having a wavelength of 248 nm), an ArF excimer laser (having a wavelength of 193 nm), etc. As for the NA of the projection optical system, an exposure apparatus equipped with a projection optical system having an NA of 0.85 is reduced to practice. A projection optical system exceeding an NA of 1.0 is being studied by applying the immersion technology that is used for the microscope field to the semiconductor exposure apparatus.

However, various technological problems arise as the high NA advances, such as 1) difficulties of corrections of various aberrations due to the high NA, 2) increased cost disadvantages caused by a large projection optical system, 3) manufacturing difficulties of a large aperture lens for the large projection optical system, 4) design and manufacturing difficulties of an antireflection coating applied to a lens, 5) remarkable influence of the polarization in imaging, and 6) a decreased focus margin due to the reduced DOF in inverse proportion to square NA.

A description will be given of a typical projection optical system for a conventional exposure apparatus. FIG. 15 shows a structure of the conventional projection optical system. Tables 7 and 8 indicate a radius of curvature, a surface interval, an effective diameter, and an aspheric coefficient for each surface.

The projection optical system has a specification of an NA of 1.1 (immersion), a light source of the ArF excimer laser (having a wavelength of 193 nm), and the maximum object point of 53.4 mm. Calculations assume that synthetic quartz ($SiO_2$) has a refractive index of 1.5603, calcium fluoride ($CaF_2$) has a refractive index of 1.5014, and water has a refractive index of 1.4367. The values of these refractive indexes are common to the embodiments of the present invention, which will be described later.

Unlike an illumination optical system, the projection optical system in the exposure apparatus and an objective lens in a microscope are required to have performance compatible with the diffraction limits. Generally speaking, the projection optical system and the like are required to have a wavefront aberration of 0.07$\lambda$RMS or smaller as a permissible residue aberration, which is referred to as a Marechal's criterion.

The more recent semiconductor exposure apparatus is required to have a smaller wavelength aberration. The projection optical system shown in FIG. 15 has a value of 0.005$\lambda$RMS throughout the entire screen area, and has received an excellent aberrational correction.

It is understood from Table 7 that the largest lens has an effective diameter of Φ350 mm or greater in the projection optical system. The block weight in the rightmost column in Table 7 denotes the weight of the cylindrical glass block that circumscribes each lens, and of materials necessary to manufacture the lens. The calculation assumes a margin from the effective diameter to the lens outer diameter to be 5 mm, a margin from the effective diameter of the concave surface to the outer diameter of the concave surface to be 2 mm, and a polishing margin to be 1 mm. These margins are common to the following embodiments.

Japanese Patent Application, Publication No. 2004-22708 discloses, at paragraphs 0038 to 0041, and FIG. 15 etc., an imaging optical system that serves as an illumination optical system for an exposure apparatus, forms an intermediate image, and has a reduced lens diameter.

It is understood from Table 7 that about 220 kg of glass material is necessary to manufacture the projection optical system. Therefore, when expensive synthetic quartz for the ArF excimer laser is used to manufacture the projection optical system, the whole exposure apparatus becomes expensive due to the material cost of the optical element.

In addition, the glass material used for the semiconductor exposure apparatus should maintain the homogeneity extremely high and the birefringence extremely low, and it is technically difficult to satisfy the specification in the glass material having a large diameter.

Moreover, a diameter of the above conventional projection optical system exponentially increases, as the high NA scheme advances. FIG. 6 shows a relationship between the NA and the lens diameter in various types of projection optical systems, as disclosed in SPIE (The International Society for Optical Engineering), February of 2003. According to FIG. 6, the lens diameter increases nonlinearly in the projection optical system as the NA increases. The conventional projection optical system shown in FIG. 15 is an immersion dioptric optical system that uses an aspheric lens, and the lens diameter suddenly increases as the NA exceeds 1.05. The glass material cost and the manufacturing difficulty increasingly will rise in designing and manufacturing a future projection optical system having a higher NA that meets the demands for the improved resolving power.

According to FIG. 6, a catadioptric projection optical system has a smaller diameter than a dioptric projection optical system. However, the catadioptric system should use a mirror (reflective element) that has a higher manufacturing sensitivity than a lens (refractive element), and poses higher design and manufacturing difficulties than the dioptric system. Therefore, instead of using the catadioptric system, the dioptric system preferably forms a projection optical system having a high NA.

BRIEF SUMMARY OF THE INVENTION

Accordingly, the present invention is directed to a dioptric projection optical system that reconciles both the high NA scheme and a restraint of a large size or aperture, and provides an excellent aberrational correction.

A projection optical system according to one aspect of the present invention used for an exposure apparatus to projecting a reduced size of an image of an object onto an image plane includes plural refractive elements that dispense with a reflective element having a substantial optical power, wherein the projection optical system forms an intermediate image.

An exposure apparatus according to another aspect of the present invention includes an illumination optical system for illuminating an original from light from a light source, and the above projection optical system for projecting a pattern of the original onto an object to be exposed.

A device manufacturing method according to still another aspect of the present invention includes the steps of exposing an object using the above exposure apparatus, and developing the object that has been exposed.

Other objects and further features of the present invention will become readily apparent from the following description of the preferred embodiments with reference to the accompanying drawings.

DETAILED DESCRIPTION OF THE PREFERRED EMBODIMENTS

First Embodiment

Figure 1:
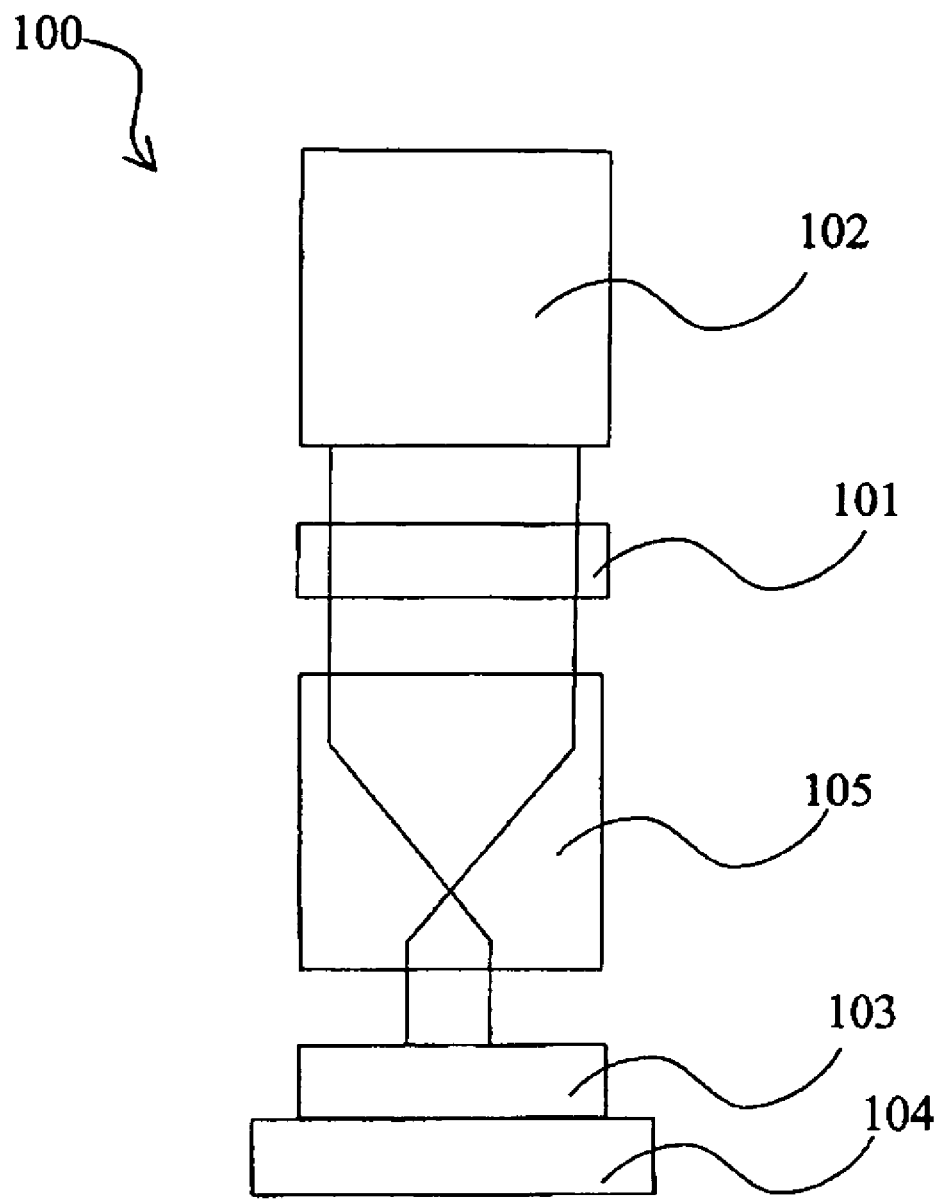
FIG. 1 is a schematic view of a structure of an exposure apparatus that includes a projection optical system according to one embodiment of the present invention.

With reference to the accompanying drawings, a description will be given of a referred embodiment according to the present invention. Referring now to FIG. 1, a description will be given of an exposure apparatus according to one aspect of the present invention.

The exposure apparatus 100 includes an illumination apparatus 102 that illuminates an original 101, such as a mask and a reticle, which has a circuit pattern, a stage 104 that supports a plate or an object to be exposed, such as a wafer, and a projection optical system 105 that projects the light from the pattern from the illuminated reticle 101 onto the wafer 103.

The exposure apparatus 100 is a projection exposure apparatus that exposes onto the wafer 103 a circuit pattern of the reticle 101, for example, in a step-and-repeat or a step-and-scan manner. Such an exposure apparatus is suitable for a sub-micron or quarter-micron lithography process. This embodiment exemplarily describes a step-and-scan exposure apparatus (which is also called "a, scanner").

The "step-and-scan manner," as used herein, is an exposure method that exposes a reticle pattern onto a wafer by continuously scanning the wafer relative to the reticle, and by moving, after an exposure shot, the wafer stepwise to the next exposure area to be shot. The "step-and-repeat manner" is another mode of exposure method that moves a wafer stepwise to an exposure area for the next shot, for every cell projection shot.

The illumination apparatus 102 illuminates the reticle 101 that has a circuit pattern to be transferred, and includes a light source unit and an illumination optical system.

The light source unit uses, for example, a laser light source, such as an ArF excimer laser with a wavelength of approximately 193 nm and a KrF excimer laser with a wavelength of approximately 248 nm. However, the laser type is not limited to excimer lasers and, for example, a $F_2$ laser with a wavelength of approximately 157 nm and a YAG laser may be used. Similarly, the number of laser units is not limited.

For example, two independently acting solid lasers would cause no coherence between these solid lasers and significantly reduces speckles resulting from the coherence. An optical system for reducing speckles may swing linearly or rotationally. When the light source unit uses the laser, it is desirable to employ a beam shaping optical system that shapes a parallel beam from a laser source to a desired beam shape, and an incoherently turning optical system that turns a coherent laser beam into an incoherent one. A light source applicable for the light source unit is not limited to a laser, and may use one or more lamps such as a mercury lamp and a xenon lamp.

The illumination optical system is an optical system that illuminates the reticle 101 using the light from a light source section, and includes a lens, a mirror, a light integrator, a stop, and the like. For example, the illumination optical system includes, in order from the light source side, a condenser lens, a fly-eye lens, an aperture stop, a condenser lens, a slit, and an imaging optical system. The illumination optical system can use any light regardless of whether it is axial or non-axial light. The light integrator may include a fly-eye lens or an integrator formed by stacking two sets of cylindrical lens array plates (or lenticular lenses), and can be replaced with an optical rod or a diffractive element.

The reticle 101 is made, for example, of quartz, has a circuit pattern or image to be transferred, and is supported and driven by a reticle stage (not shown). The diffracted light emitted from the reticle 101 passes through the projection optical system 105 and is then projected onto the wafer 103. the plate 103 is an object to be exposed, and the resist is applied on its irradiated surface. The reticle 101 and the wafer 103 are located in an optically conjugate relationship.

The scanner scans the reticle and the wafer and transfers the reticle pattern onto the wafer. A step-and-repeat exposure apparatus (referred to as a "stepper") maintains the reticle and the plate still when exposing the reticle pattern.

The projection optical system 105 of this embodiment is an optical system that basically includes only plural lens elements and a stop. In other words, the projection optical system 105 does not include a reflection element having a substantially optical power, but may include a reflection element having no substantially optical power. "Having a substantially optical power," as used herein, means having an optical power large enough for the optical power and magnification of the entire projection optical system.

In the projection optical system 105, Any necessary correction of the chromatic aberration may be accomplished by using a plurality of lens units made from glass materials having different dispersion values (Abbe values) or arranging a diffractive optical element such that it disperses light in a direction opposite to that of the lens unit.

The photoresist is applied onto the wafer 103. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process to enhance the adhesion between the photoresist and a base (i.e., a process to increase the hydrophobicity by applying a surface active agent), through a coat or vaporous process using an organic coating such as HMDS (Hexamethyl-disilazane). The pre-bake treatment is a baking (or burning) step, which makes the photoresist softer than after development and removes the solvent.

The stage 104 supports the wafer 103. The stage 104 may use any structure known in the art, and thus a detailed description of its structure and operation is omitted. The stage 104 may use, for example, a linear motor to move the wafer 103 in the XY directions. The reticle 101 and wafer 103 are, for example, scanned synchronously, and the positions of the stage 104 and a reticle stage (not shown) are monitored, for example, by a laser interferometer and the like, so that both are driven at a constant speed ratio.

The stage 104 is installed on a stage stool supported on the floor and the like, for example, via a dampener. The reticle stage and the projection optical system 105 are installed on a barrel stool support (not shown), for example, via a dampener, to the base frame placed on the floor.

In exposure, the light is emitted from the light source section in the illumination apparatus 102, e.g., Koehler-illuminates the reticle 101 via the illumination optical system. The light that passes through the reticle 101 and reflects the reticle pattern is imaged onto the wafer 103 by the projection optical system 105. The image of the mask pattern is reduced by the projection optical system 105 and formed on the wafer 103.

In this exposure apparatus, it is important to reduce a (lens) diameter in the projection optical system to avoid increased manufacturing difficulties and costs of the glass material associated with a large size of the projection optical system. The weight of the glass material increases in proportion to the square of the diameter when another condition is the same. When the diameter of the projection optical system becomes half even if the overall length becomes double, the weight of the glass material becomes roughly half and the cost reduction effect can be expected.

A more detailed description will be given by assuming a cylinder having a height L, a diameter r×L, and a volume V. Then, the volume V is given as follows:

$$V = \pi \times (r^2) \times (L^3)/4$$

Figure 11:
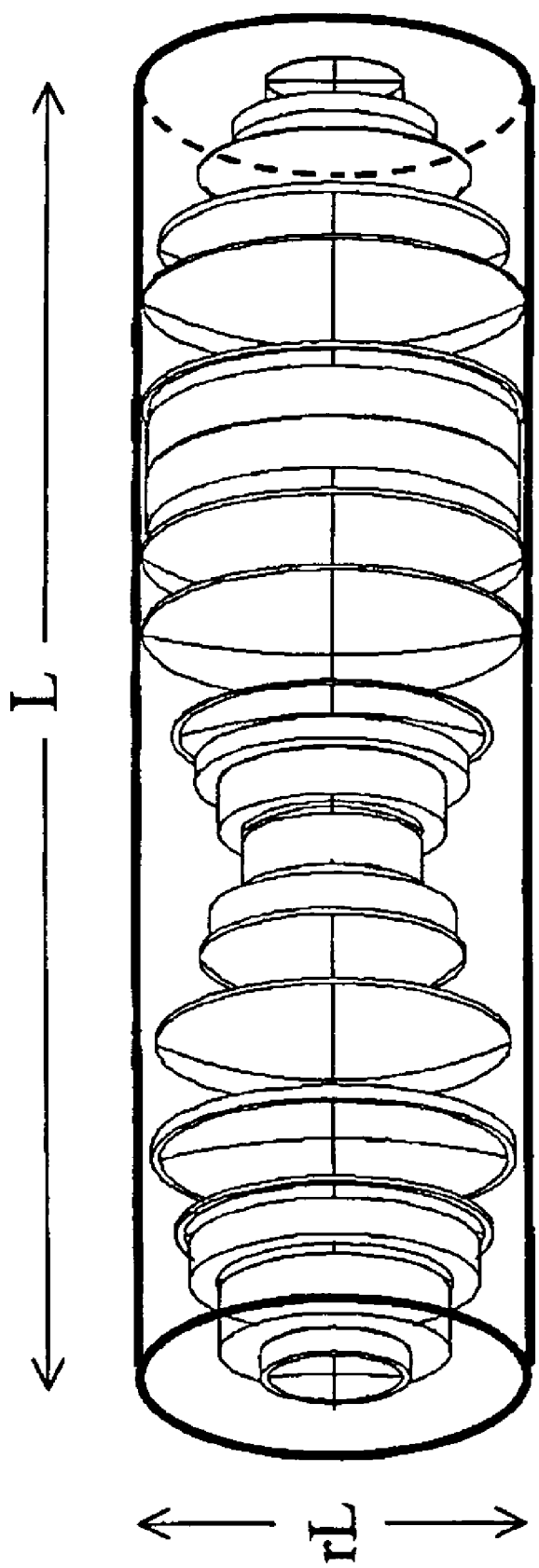
FIG. 11 is a view for explaining an evaluation of the glass material's volume.

When a total of the glass material block of each lens in the projection optical system having the overall length of L and the maximum diameter of r×L is considered, it is clear from FIG. 11 that it does not exceed the volume of the above cylinder. Therefore, the glass material block's volume can be roughly estimated at the volume V, and its weight can be calculated.

Figure 12:
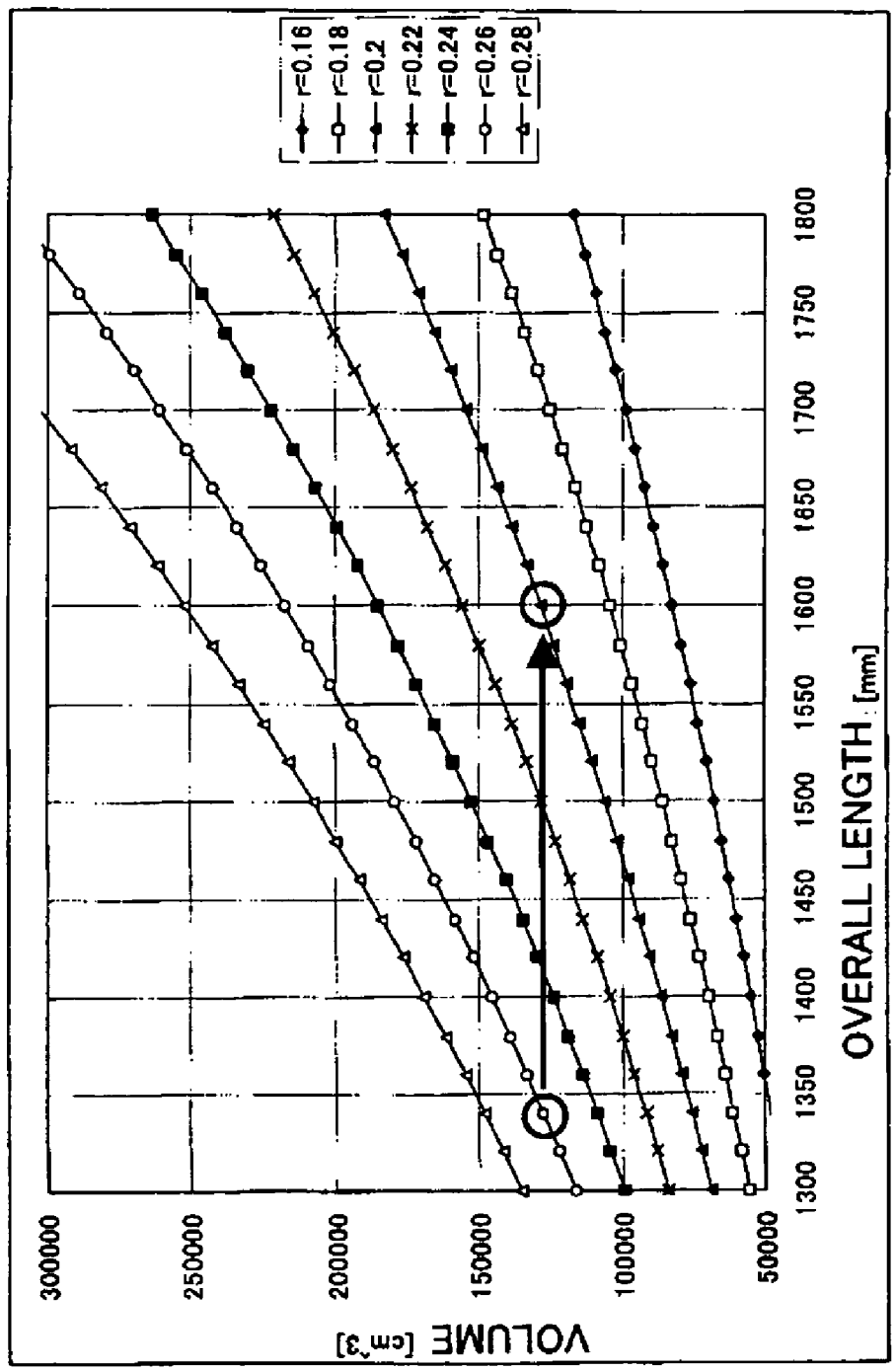
FIG. 12 is a view showing a relationship among the glass material's volume, an overall length and the diameter.

FIG. 12 plots changes of cylindrical volume V with respect to the height L and various r. Since the conventional projection optical system shown in FIG. 15 has L of 1337 mm and r of 0.26, it has a volume enclosed by the left circle in FIG. 12. On the other hand, when a new projection optical system has an overall length L of about 1600 mm and r is 0.2, it has the same volume as that of the conventional projection optical system. Therefore, it is understood that r, which is a ratio of the diameter to the overall length, is preferably 0.2 or smaller when the projection optical system has an overall length longer by about 1.2 times than the conventional one.

In general, in order to reduce a diameter of the optical system, it is necessary to enhance the optical power of the positive lens in the optical system. The (refractive) power of the lens is a reciprocal of a focal length. For example, if the powers of the second to fifth lenses L2 to L5 in FIG. 15 can be increased or their focal lengths are shortened, the spread of the light from the object point can be maintained small. As a result, the diameter of the fifth lens L5 can be maintained small. When powers of the thirteenth to twenty-first lenses L13 to L21 can be increased in FIG. 15, the spread of the light condensing upon the image plane can be maintained small.

On the other hand, one index of the aberrational correction in the optical system is the Petzval sum. The Petzval sum is a sum of values of each lens' power/refractive index throughout the entire system. Unless there is a correction that makes the Petzval sum sufficiently close to 0, the curvature of field remains uncorrected and high-quality optical system cannot be presented. However, when the power of the positive lens in the optical system is increased so as to reduce the lens diameter, the Petzval sum greatly aggregates in the positive direction. In order to correct this aggregation, the power of the negative lens in the projection optical system should be increased to maintain a good balance. In other words, the power of the positive lens cannot be increased with no restriction in the optical system but can be increased only if the Petzval sum is correctable.

Figure 15:
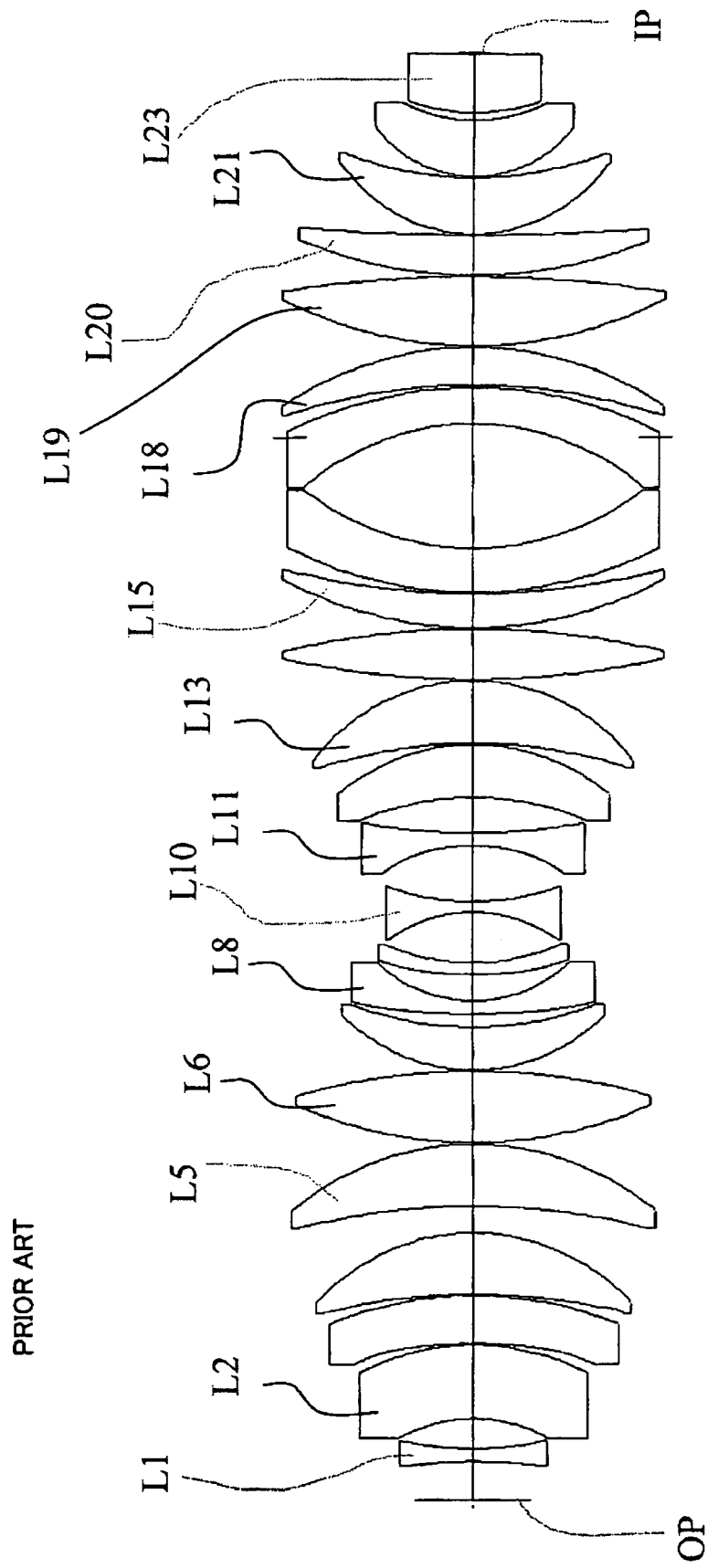
FIG. 15 is a sectional view of a conventional projection optical system.

In the conventional projection optical system shown in FIG. 15, the positive lens unit used to correct the Petzval sum is only one unit that includes eighth to eleventh lenses L8 to L11. Therefore, the Petzval sum correctable by one positive lens unit naturally has a limit, the positive lens power cannot be increased, and it is consequently difficult to maintain the diameter small. Thus, it is difficult to maintain the diameter small in the conventional projection optical system, firstly because the number of negative lenses is too small to correct the Petzval sum.

The enhanced power of the positive lens leads to the small radius of curvature of each lens surface, thereby increasing the spherical aberration amount from each lens surface. In this case, the spherical aberration should be corrected by another lens.

The lens suitable to correct the spherical aberration is a lens arranged near the pupil where the light spreads, for example, the thirteenth to nineteenth lenses L13 to L19 in the projection optical system shown in FIG. 15. However, an attempt to reduce the diameter of the projection optical system should increase the powers of the thirteenth to nineteenth lenses L13 to L19, and they cannot be used to correct the spherical aberration although they can generate the spherical aberration. Since the projection optical system does not include an element suitable to correct another spherical aberration, it is difficult to effectively correct the generated spherical aberration. Thus, it is difficult to reduce the diameter in the conventional projection optical system, secondly because the spherical aberration correction has a small degree of freedom.

In order to solve the above problems, the projection optical system of this embodiment includes, in order from the object (or reticle 101) side to the image (or wafer 103) side, a first unit having a positive optical power (refractive index), a first pupil, a second unit having a positive optical power, an intermediate image plane, a third unit having a positive optical power, a second pupil plane, and a fourth unit having a positive optical power.

In this embodiment, each unit has plural (e.g., four or more) lenses. The first pupil is formed between the lens in the first unit closest to the image side and the lens in the second unit closest to the object side. The intermediate image is formed between the lens in the second unit closest to the image side and the lens in the third unit closest to the object side. The second pupil is formed between the lens in the third unit closest to the image side and the lens in the fourth unit closest to the object side.

The following description refers to an optical system from the object surface to the intermediate image plane (or both the first and second units) as a first imaging system, and an optical system from the intermediate image plane to the final image plane (or both the third and fourth units) as a second imaging system.

While this embodiment defines each unit using the first and second pupil planes and intermediate image plane among lenses as borders, as described above, it is conceivable that at least one of the first and second pupil planes and intermediate image plane exists inside one lens. In this case, each unit may be defined by using the first and second pupil planes and intermediate image plane among lenses as borders, while each unit is assumed to include plural optical (or lens) surfaces.

The above configuration can arrange a negative lens only in the three or first to third units among the first to fourth units. The negative lens is preferably arranged at or near a boundary between adjacent units that include the negative lens.

As a result, the number of negative lenses is more than the conventional one, and the Petzval sum can be easily corrected. Two pupil planes provide more positions suitable to correct the spherical aberration than the conventional one, consequently facilitating the correction of the spherical aberration caused by the reduced diameter.

The projection optical system of this embodiment is characterized in easy corrections of three types of aberrations through designing, such as magnification chromatic aberration, telecentricity and distortion. While the conventional projection optical system corrects these three types of aberrations using the lens unit near the object side, because the lens unit at the object side can easily separate the lights emitted from different object points and is suitable to correct the aberration that depends upon the angle of field.

For this purpose, only one unit that includes the first to sixth lenses L1 to L6 is suitable to correct these three types of aberrations in the conventional example shown in FIG. 15. On the other hand, this embodiment provides three suitable lens units to correct the three types of aberrations, such as a lens unit in the first unit at the object side and a lens unit in the second unit close to the intermediate image plane, and a lens unit in the third unit close to the intermediate image plane. Therefore, this embodiment provides the lens configuration that can more easily correct the above three aberrations.

In addition to the aforementioned aberrations, the projection optical system of this embodiment is suitable to correct the coma, because the back half part in the first imaging system (close to the intermediate image plane side) and the front part in the second imaging part (close to the intermediate image plane side) have symmetrical optical paths for the upper and lower rays and it is easy to select the lens shapes so that comas that occur these parts can cancel each other.

As discussed above, the projection apparatus of this embodiment can easily reduce the diameter, and correct various aberrations, such as the magnification chromatic aberration, telecentricity, and distortion. This means that a projection optical system having a NA similar to the conventional one, such as 0.8 to 1.1, can be formed with a smaller diameter, or that a projection optical system having a diameter similar to the conventional one can be formed with a larger NA, such as 1.1 or greater.

For example, while it has conventionally been considered very difficult to form a dioptric projection optical system having a NA of 1.2 and a projection magnification of 1.4 of an entire system, the lens configuration of this embodiment can provide that.

The projection optical system of this embodiment has an intermediate image plane before the final image plane, and can effectively remove the stray light, such as ghost and flare, by arranging a field stop at or near the intermediate image plane conjugate with the final image plane. In this embodiment, the imaging performance to the intermediate image plane is not so high as the imaging performance required for the final image plane. In other words, this embodiment does not require the imaging state that condenses all the effective rays upon almost one point.

The projection optical system of this embodiment characteristically has two pupil planes different from the conventional projection optical system. This characteristic provides finer NA control than the conventional one, when the iris stop having a variable stop diameter is provided on or near at least one of the pupil planes.

The projection optical system of this embodiment does not use a reflective element, such as a mirror, and solves the problem associated with the catadioptric projection optical system that includes a reflective member with an optical power and is generally hard to manufacture due to the polishing precision and decentering precision. The projection optical system of this embodiment does not have a reflective element that is hard to manufacture, and may maintain the precision similar to the conventional dioptric projection optical system.

However, as described above, the present invention does not exclude any reflective element at all, and may include a reflective element that has no substantial optical power, such as a plane mirror.

In addition, the catadioptric system often has a deflected optical axis, which is very difficult to adjust in manufacturing, whereas the projection optical system of this embodiment does not have a reflective element, such as a plane mirror, and has a straight optical axis, eliminating the difficulties of the optical axis adjustment, and applying the approach similar to the conventional dioptric projection optical system.

In addition, the catadioptric system deflects the optical path using the reflective element, such as a mirror, needs interference between the outgoing and incoming optical paths, and cannot use an area near the optical axis on the image plane for exposure. Therefore, it cannot help using an arc or rectangular exposure area or slit on the area that eliminates the optical axis in the exposure field. Therefore, it has the following problems: 1) The object surface and image plane should have effective diameters, increasing the size of the projection optical system; and 2) the exposure aberration occurs asymmetrically and is hard to correct.

On the other hand, the projection optical system of this embodiment does not deflect the light, uses the on-axial image point for exposure, and solve the above problems, since it does not use the reflective element, such as a plane mirror.

Here, the projection magnification of the first and second imaging systems for the projection optical system of this embodiment are considered with a paraxial theory.

Figure 5:
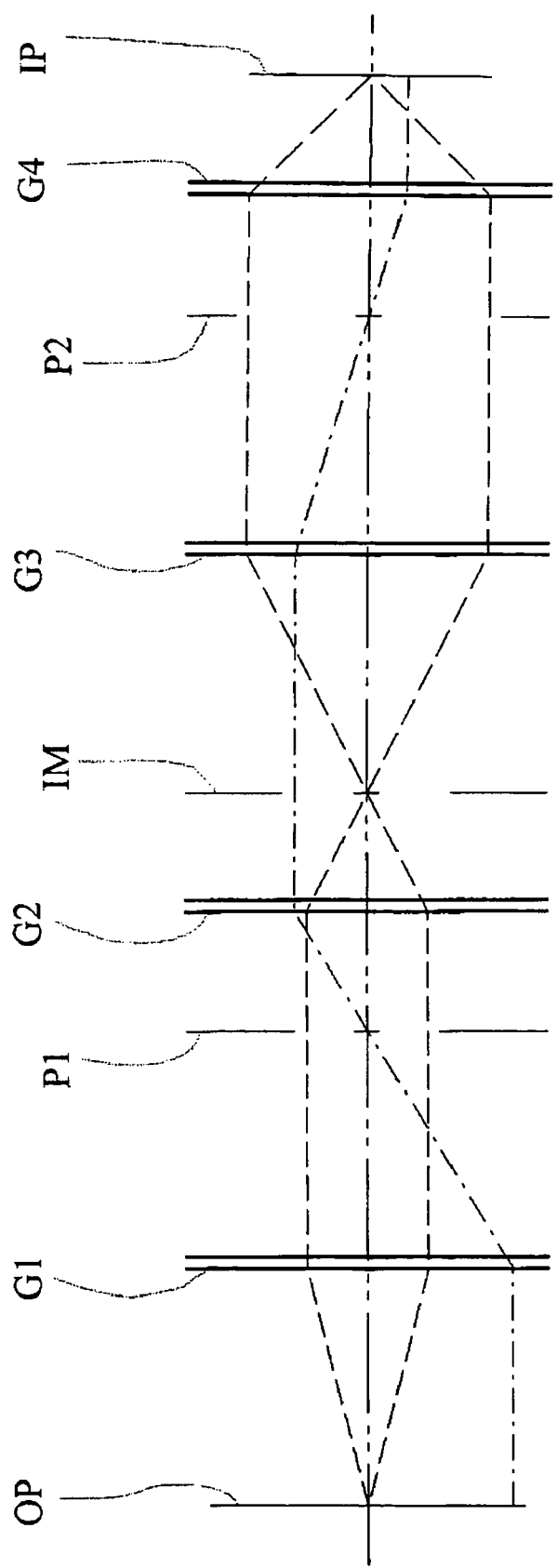
FIG. 5 is a view showing a paraxial model of the projection optical system of the first embodiment.
Figure 6:
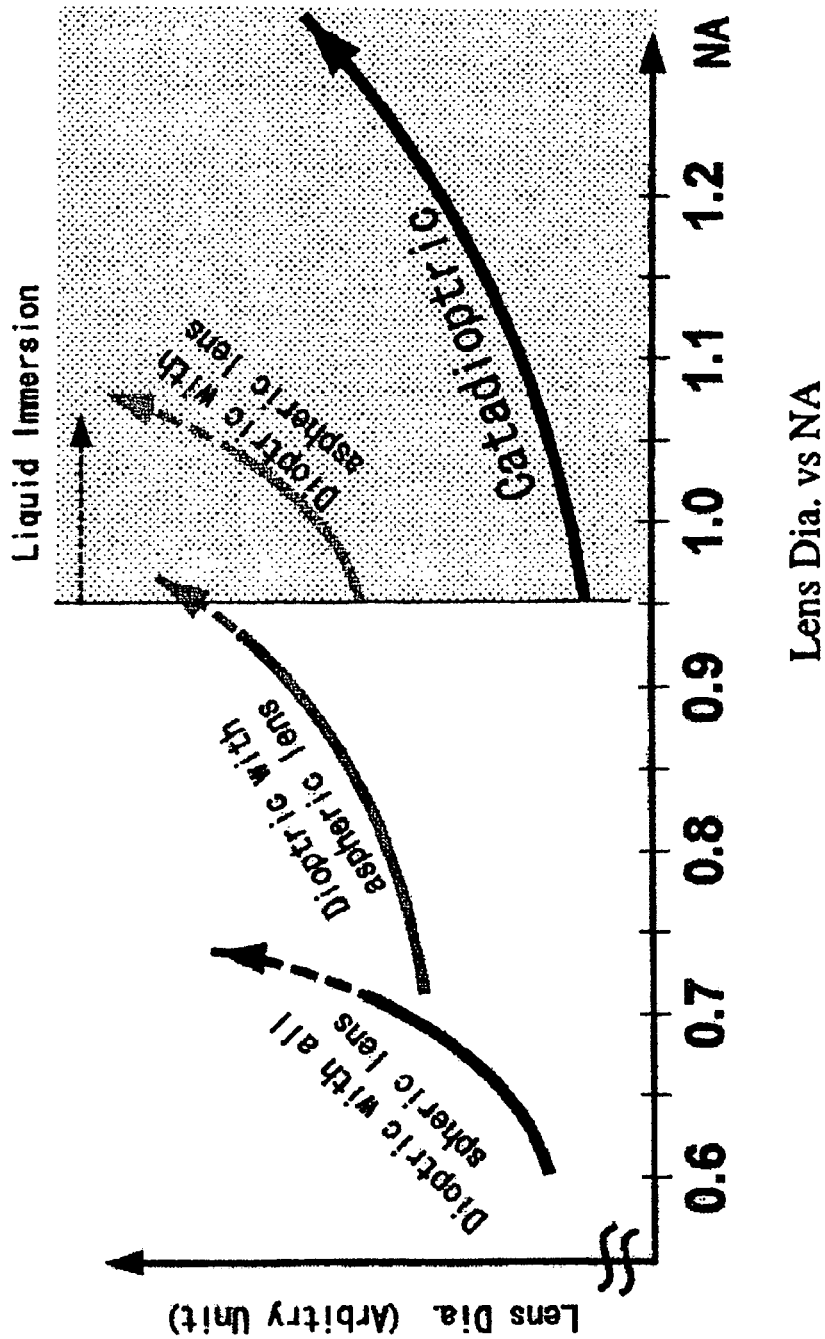
FIG. 6 is a view showing a relationship between the NA and diameter of the projection optical system.

FIG. 5 shows a paraxial model of the projection optical system. This model approximate the first to fourth units G1 to G4 with a single thin lens (shown by a double line), and arranges a first pupil plane P1 between the first unit G1 and the second unit G2, an intermediate image plane IM between the second unit G2 and the third unit G3, and a second pupil P2 between the third unit G3 and the fourth unit G4. OP is an object surface and IP is an image plane. In FIG. 5, a broken line denotes a object paraxial ray, and an alternate long and short dash line denotes a pupil paraxial ray, and an alternate long and two short dashes line denotes an optical axis of the projection optical system.

Figure 7:
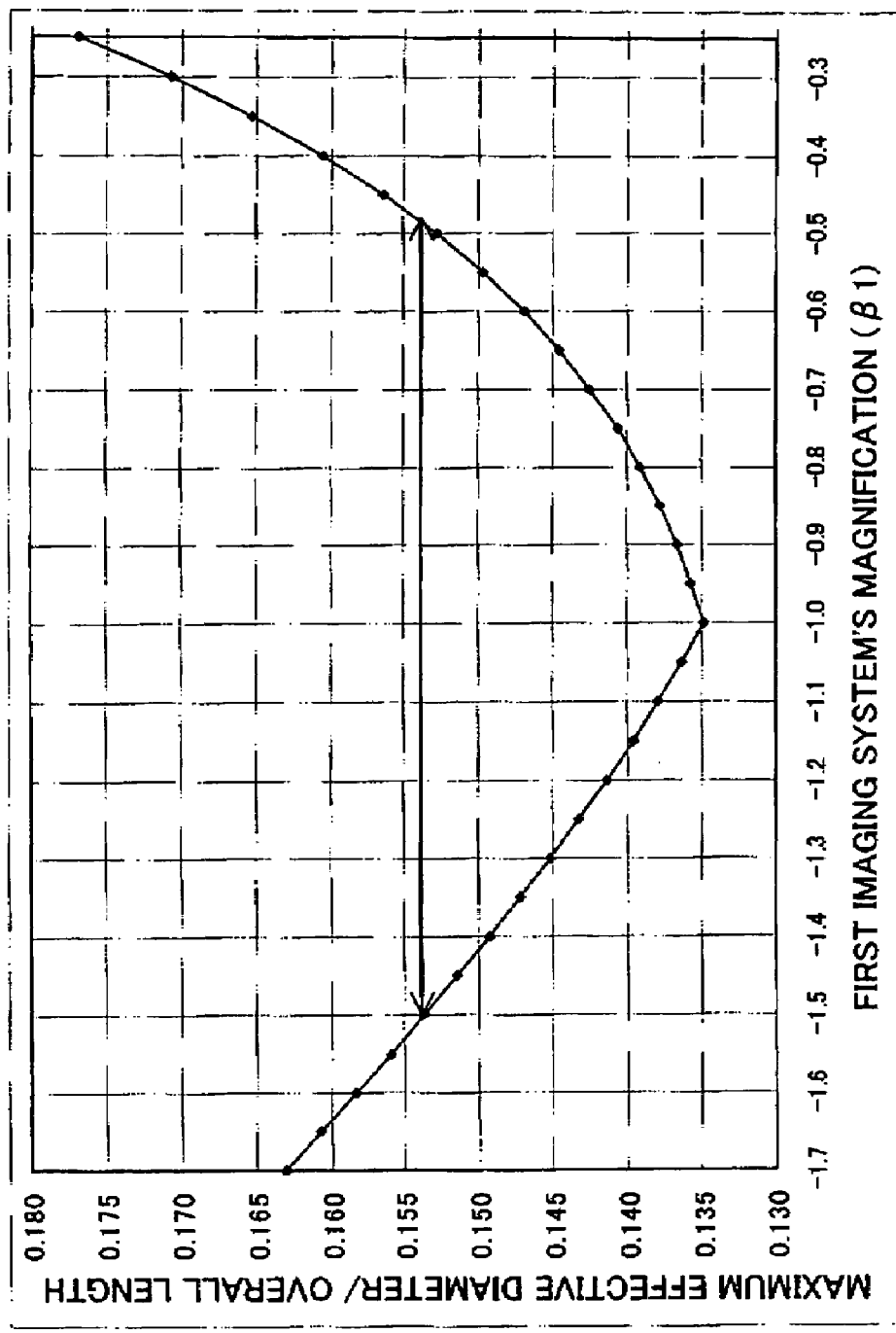
FIG. 7 is a view showing a result of a paraxial analysis result of the projection optical system.

This paraxial model sets five parameters, such as the overall length, the NA, the object point, and the projection magnification of the projection optical system and the projection magnification (partial magnification) of the first imaging system under the following two conditions: 1) the first imaging system (G1, G2) and the second imaging system (G3, G4) are telecentric at both sides; and 2) The maximum effective diameter among the units is reduced. Then, the focal length of each unit is uniquely determined, and the effective diameter of each unit can be calculated. FIG. 7 shows the result.

FIG. 7 plots values normalized by the overall length of the projection optical system in the ordinate axis relative to a partial magnification $\beta 1$ of the first imaging system in the abscissa axis. Other parameters are fixed, such as the projection magnification of 0.25, the overall length of 1600 mm, the NA of 0.86 and the object point of 55 mm of the projection optical system. According to this result, $\beta 1$ of −1.0 provides a minimum effective diameter (maximum effective diameter/overall length=0.135), and the diameter increases when $\beta 1$ increases or decreases from −1.0. This means that $\beta 1$ has a preferable value in forming the projection optical system having a small diameter, and the preferable range is $\beta 1 = -1.0 \pm 0.5$ when an increase of an effective diameter of about 15% is permissible from the minimum value.

In other words, as a result of the paraxial analysis, a range of $-1.5 \leq \beta 1 \leq -0.5$ is preferable for partial magnification $\beta 1$ of the first imaging system.

The projection magnification $\beta$ of the reduction projection optical system is $0.0 < \beta < 1.0$.

It should be noted that a value of (the effective diameter of the projection optical system)/(the overall length of the projection optical system), which is shown here, is a paraxial value. When the paraxial model is applied to a thick lens to obtain data of the actual projection optical system, an error to the ideal paraxial value occurs and the minimum value of 0.135 is not obtained in the actual system. Empirically, this value is 0.20 or smaller, more specifically, between about 0.15 and about 0.20 (0.15≦(effective diameter of the projection optical system)/(overall length of the projection optical system)≦0.20).

When the partial magnification $\beta 1$ of the first imaging system changes in the above range, values of the focal lengths f1 to f4 of the first to fourth units are as follows:

0.1956≦f1/L≦0.1176
0.0978≦f2/L≦0.1765
0.1378≦f3/L≦0.1765
0.0689≦f4/L≦0.0294

In the preferable range of $\beta 1$, each unit's focal length has the following relationships, and it is understood that a value of the focal length of each unit divided by the overall length L has a preferable range:

f1≧f4
f2≧f4
f3≧f4

It should be noted that these focal lengths are values of the paraxial model, and slightly divert from the ideal values in the actual projection optical system having thick lenses. In designing the actual projection optical system, it is understood that these values preferably have a value divided by L between about 0.04 and about 0.05 for f1, f2 and f3, and a value divided by L between about 0.01 and about 0.02 for f4. In other words, the following relationships are met:

0.04≦f1/L≦0.50
0.04≦f2/L≦0.50
0.04≦f3/L≦0.50
0.01≦f4/L≦0.20

NUMERICAL EXAMPLE 1

Figure 2:
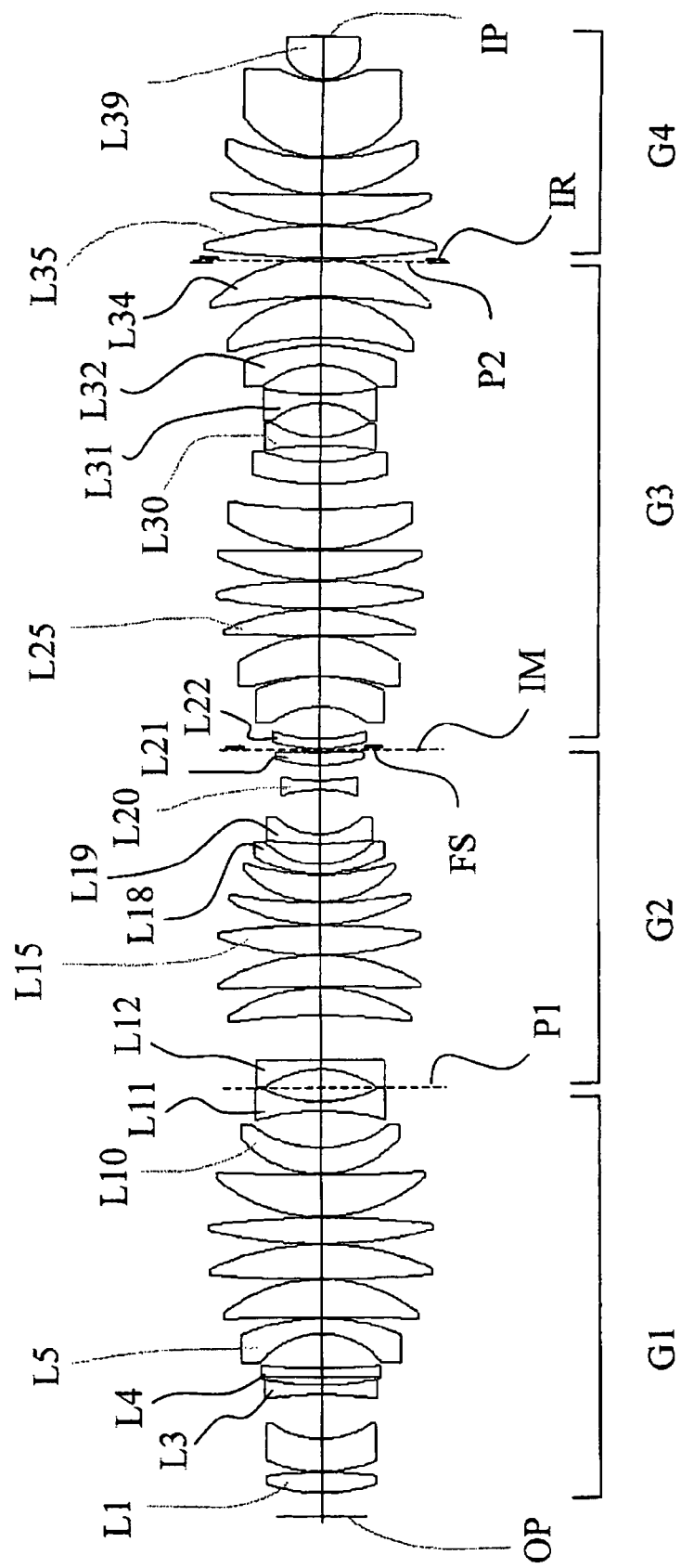
FIG. 2 is a sectional view of a projection optical system according to a numerical example 1 of the first embodiment of the present invention.

FIG. 2 shows a numerical example 1 of the projection optical system of the above embodiment. This projection optical system is directed to the projection optical system of the above embodiment that has the same specification as that in FIG. 15. Tables 1 and 2 show the specification including the effective diameter, radius of curvature, surface interval, material, and block weight of the glass material.

In Table 1, the "surface number" is an order of surfaces from the object side, and the "surface type" indicates whether the surface is the object surface, pupil plane, intermediate image plane or final image plane, or aspheric surface. Table 2 provides coefficients of the aspheric surface. "E-X" means $10^{-X}$, and this also applies to the following numerical examples.

Figure 8:
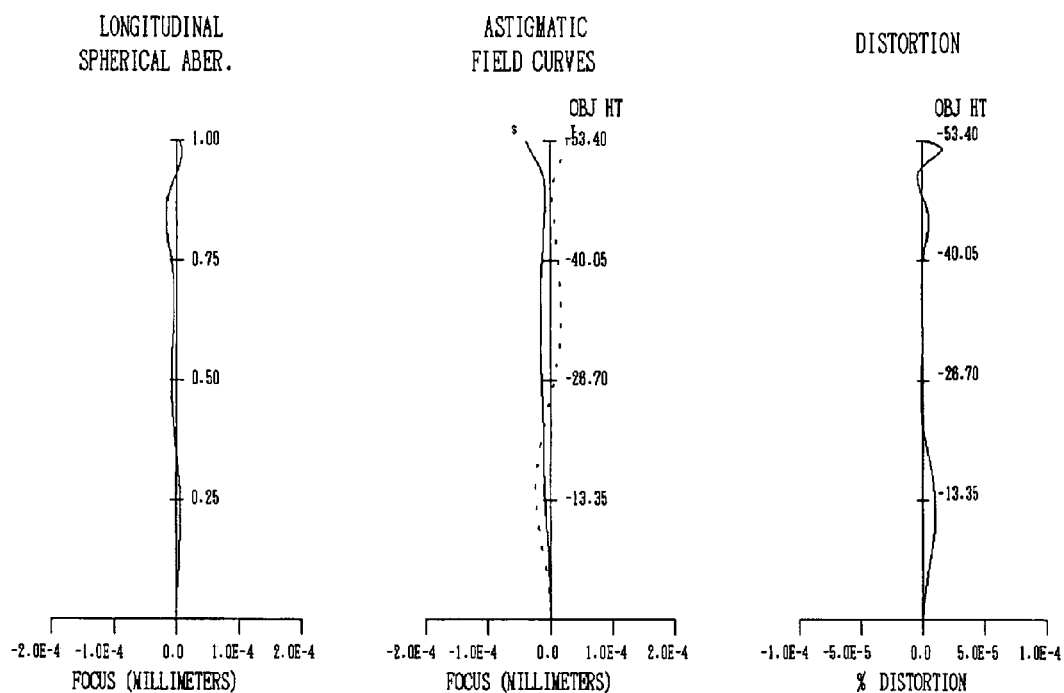
FIG. 8 is an aberrational diagram of the projection optical system according to the numerical example 1.

FIG. 8 shows a aberration diagram of the projection optical system, in order from the left of the spherical aberration, curvature of field, astigmatism, and distortion, and this also applies to the following numerical examples.

The wavefront aberration amount of the projection optical system is 0.003λRMS of smaller throughout the entire screen, and extremely excellent aberrational correction is exhibited. The projection optical system has the following specification: the exposure wavelength of 193 nm, the NA of 1.10 (immersion), the object point of 53.4 mm, and the projection magnification of 0.25. The first imaging system (G1, G2) has a partial magnification of −0.999, and the maximum effective diameter/overall length of the projection optical system is 0.152.

First to eleventh lenses L1 to L11 form a first unit G1, and twelfth to twenty-first lenses L12 to L21 form a second unit G2. Twenty-second to thirty-fourth lenses L22 to L34 form a third unit G3, and thirty-fifth to thirty-ninth lenses L35 to L39 form a fourth unit G4. A first pupil P1 (referred to as "pupil plane 1" in Table) exists between the first unit G1 and the second unit G2, and an intermediate image plane IM exists between the second unit G2 and third unit G3. A second pupil P2 (referred to as "pupil plane 2" in Table) exists between the third unit G3 and the fourth unit G4. A field stop FS is provided on or near the intermediate image plane IM, and an iris stop IR is provided on or near the second pupil P2.

The negative lenses that contribute to corrections of the Petzval sum are the third, fourth and eleventh lenses L3, L4 and L11 in the first unit G1, the twelfth, eighteenth, nineteenth and twentieth lenses L12, L18, L19 and L20 in the second unit G2, and the thirtieth, thirty-first, and thirty-second lenses L30, L31 and L32 in the third unit G3.

While the projection optical system in this numerical example has a similar specification and equivalent imaging performance to those of the conventional projection optical system shown in FIG. 15, the projection optical system in this numerical example has an effective diameter of Φ266 mm much smaller than an effective diameter of Φ350 mm of the conventional projection optical system.

The projection optical system in this numerical example has an overall length of 1757.6 mm, 1.3 times as long as the overall length of 1337.5 mm of the conventional projection optical system, but the projection optical system in this numerical example has a glass block weight of 129.3 kg, 58.7% as heavy as the glass block weight of 220.2 kg of the conventional projection optical system. Thus, the projection optical system provides excellent cost reduction and weight saving effects.

The instant configuration elongates an overall length and reduces a diameter in the conventional configuration. The maximum effective diameter/overall length is 0.262 in the conventional projection optical system, whereas it is 0.152 in this numerical example.

The image offset amount is 2.9 nm per a wavelength change of 0.2 pm at the most off-axial image point due to the magnification chromatic aberration in the projection optical system of this numerical example. This value is 9.4 nm in the conventional projection optical system shown in FIG. 15. It is therefore understood that the projection optical system of this numerical example has an excellent correcting capability of the magnification chromatic aberration. The dispersion value (or refractive index change per a wavelength change of 1 pm) of each glass material for use with the calculation is $1.58 \times 10^{-6}$ for synthetic quartz ($SiO_2$), $0.99 \times 10^{-6}$ for calcium fluoride ($CaF_2$), and $2.10 \times 10^{-6}$.

The tangential value of the inclined angle to the optical axis of the principal ray emitted from the most off-axis object point, referred to as principal ray angle hereinafter, is 0.0027. This value is 0.0054 in the conventional projection optical system shown in FIG. 15. It is therefore understood that the projection optical system of this numerical example has an excellent telecentricity correcting capability.

The paraxial optical power arrangement is given as follows from an overall length L of 1664 mm, and focal lengths f1 to f4 of 212.11 mm, 205.76 mm, 248.89 mm, and 106.48 mm:

f1/L=0.1275
f2/L=0.1237
f3/L=0.1496
f4/L=0.0640

NUMERICAL EXAMPLE 2

Figure 3:
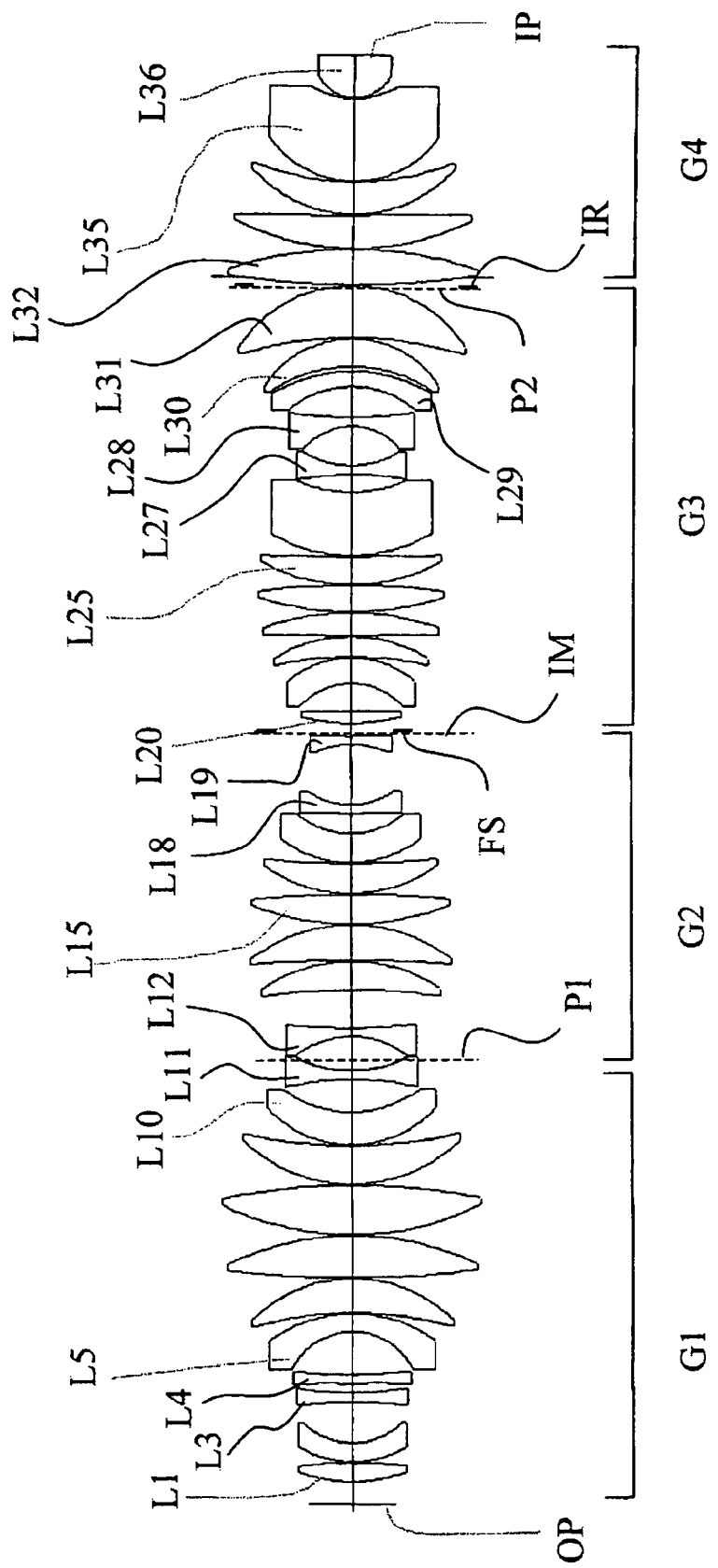
FIG. 3 is a sectional view of a projection optical system according to a numerical example 2 of the first embodiment.
Figure 9:
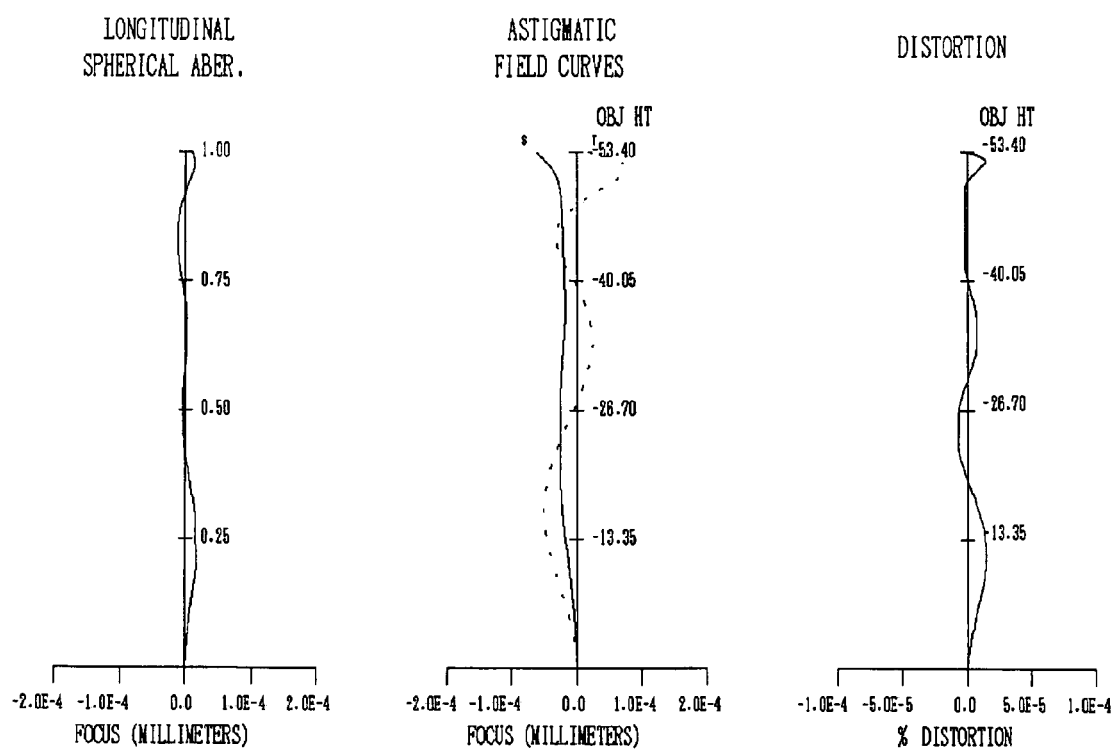
FIG. 9 is an aberrational diagram of the projection optical system according to the numerical example 2.

FIG. 3 shows a numerical example 2 of the projection optical system of the above embodiment. This projection optical system is directed to the projection optical system of the above embodiment that has the same specification as that in FIG. 15. Tables 3 and 4 show the specification including the effective diameter, radius of curvature, etc. FIG. 9 shows an aberrational diagram of the projection optical system.

The wavefront aberration amount of the projection optical system is $0.0044\lambda RMS$ of smaller throughout the entire screen, and extremely excellent aberrational correction is exhibited. The projection optical system has the following specification: the exposure wavelength of 193 nm, the NA of 1.20 (immersion), the object point of 53.4 mm, and the projection magnification of 0.25. The first imaging system (G1, G2) has a partial magnification of −0.956, and the maximum effective diameter/overall length of the projection optical system is 0.178.

First to eleventh lenses L1 to L11 form a first unit G1, and twelfth to nineteenth lenses L12 to L19 form a second unit G2. Twentieth to thirty-first lenses L20 to L31 form a third unit G3, and thirty-second to thirty-sixth lenses L32 to L36 form a fourth unit G4. A first pupil P1 exists between the first unit G1 and the second unit G2, and an intermediate image plane IM exists between the second unit G2 and third unit G3. A second pupil P2 exists between the third unit G3 and the fourth unit G4. A field stop FS is provided on or near the intermediate image plane IM, and an iris stop IR is provided on or near the second pupil P2.

The negative lenses that contribute to corrections of the Petzval sum are the third, fourth and eleventh lenses L3, L4 and L11 in the first unit G1, the twelfth, eighteenth, and nineteenth lenses L12, L18 and L19 in the second unit G2, and the twenty-seventh, twenty-eighth, and twenty-ninth lenses L27, L28 and L29 in the third unit G3.

It has conventionally been considered difficult to form a dioptric projection optical system having the projection magnification of 0.25 and the NA of 1.2 in the realistic glass material diameter restriction, but it is understood that use of the projection optical system of this numerical example maintains the maximum effective diameter to 0318 mm in the practical range. In addition, the glass weight is 161.8 kg, smaller than the conventional one, maintaining the cost saving effect. The projection optical system of this numerical example has an image offset amount of 3.3 nm due to the magnification chromatic aberration and the tangential value of the principal ray angle of 0.0028 when calculated in the same manner as that of the numerical example 1. This numerical example also has the excellent correcting capabilities of the magnification chromatic aberration and telecentricity.

The paraxial optical power arrangement is given as follows from an overall length L of 1584 mm, and focal lengths f1 to f4 of 204.66 mm, 285.85 mm, 173.10 mm, and 109.41 mm:

f1/L=0.1292
f2/L=0.1805
f3/L=0.1093
f4/L=0.0691

NUMERICAL EXAMPLE 3

Figure 4:
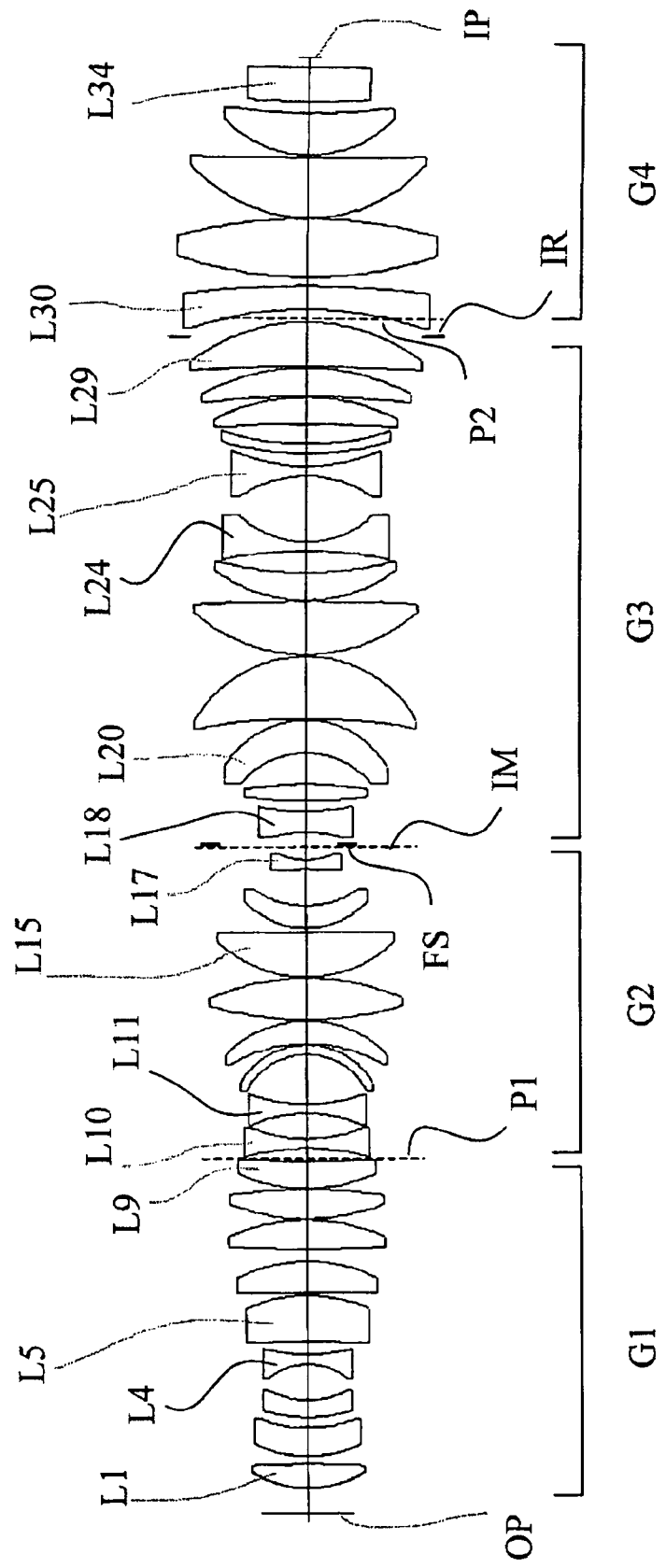
FIG. 4 is a sectional view of a projection optical system according to a numerical example 3 of the first embodiment.
Figure 10:
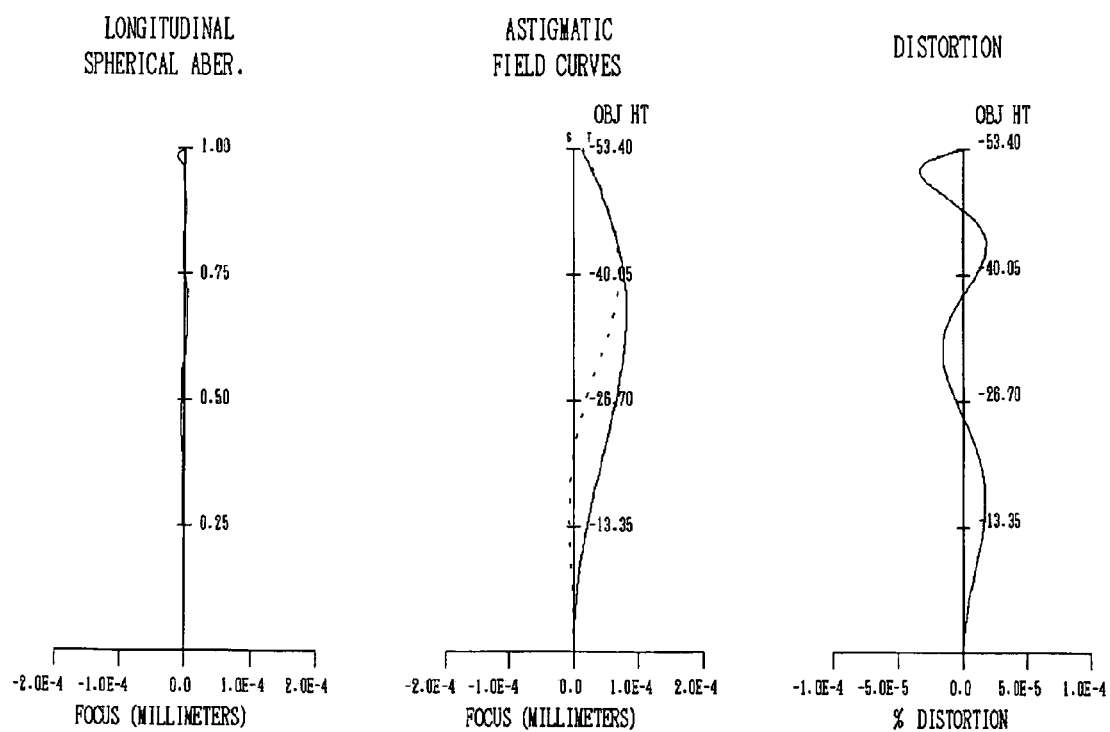
FIG. 10 is an aberrational diagram of the projection optical system according to the numerical example 3.

FIG. 4 shows a numerical example 3 of the projection optical system of the above embodiment. While the numerical examples 1 and 2 are directed to the immersion optical system, this numerical example is directed to a normal, non-immersion optical system. Tables 5 and 6 show the specification including the effective diameter, radius of curvature, etc. FIG. 10 shows an aberrational diagram of the projection optical system.

The wavefront aberration amount of the projection optical system is 0.0052λRMS of smaller throughout the entire screen, and extremely excellent aberrational correction is exhibited. The projection optical system has the following specification: the exposure wavelength of 193 nm, the NA of 0.92, the object point of 53.4 mm, and the projection magnification of 0.25. The first imaging system (G1, G2) has a partial magnification of −0.505, and the maximum effective diameter/overall length of the projection optical system is 0.177.

First to ninth lenses L1 to L9 form a first unit G1, and tenth to seventeenth lenses L10 to L17 form a second unit G2. Eighteenth to twenty-ninth lenses L18 to L29 form a third unit G3, and thirtieth to thirty-fourth lenses L30 to L34 form a fourth unit G4. A first pupil P1 exists between the first unit G1 and the second unit G2, and an intermediate image plane IM exists between the second unit G2 and third unit G3. A second pupil P2 exists between the third unit G3 and the fourth unit G4. A field stop FS is provided on or near the intermediate image plane IM, and an iris stop IR is provided on or near the second pupil P2.

The negative lenses that contribute to corrections of the Petzval sum are the fourth lens L4 in the first unit G1, the tenth, eleventh, and seventeenth lenses L10, L11 and L17 in the second unit G2, and the eighteenth, twenty-fourth, and twenty-fifth lenses L18, L24 and L25 in the third unit G3.

From this numerical example, the lens configuration of this embodiment is applicable both the immersion and dry projection optical system. The projection optical system of this numerical example has an image offset amount of 2.4 nm due to the magnification chromatic aberration and the tangential value of the principal ray angle of 0.0088 when calculated in the same manner as that of the numerical example 1. This projection optical system sufficiently corrects the magnification chromatic aberration but its correcting capability of the telecentricity is as high as the conventional configuration, because thus designed projection optical system has preference to a correction of a large spherical aberration in the air layer from the final (or thirty-fourth) lens L34 to the image plane.

The paraxial optical power arrangement is given as follows from an overall length L of 2245 mm, and focal lengths f1 to f4 of 249.56 mm, 232.29 mm, 297.11 mm, and 128.82 mm:

f1/L=0.1112
f2/L=0.1035
f3/L=0.1323
f4/L=0.0574

Thus, this embodiment can provide a projection optical system that has a reduced diameter, and sufficiently corrects the magnification chromatic aberration, the telecentricity, and the distortion, or that has a large NA while maintaining the conventional diameter. Thus, this embodiment can solve the problems of manufacturing difficulties and cost increase of the glass material in an attempt to form a large projection optical system, and instead design, manufacture and supply a high-quality projection optical system.

While this embodiment describes an arrangement of a single intermediate image plane in the projection optical system, the projection optical system may have plural intermediate image planes. In addition, this embodiment describes four-unit projection optical system, the projection optical system may have five units or more.

Second Embodiment

Figure 13:
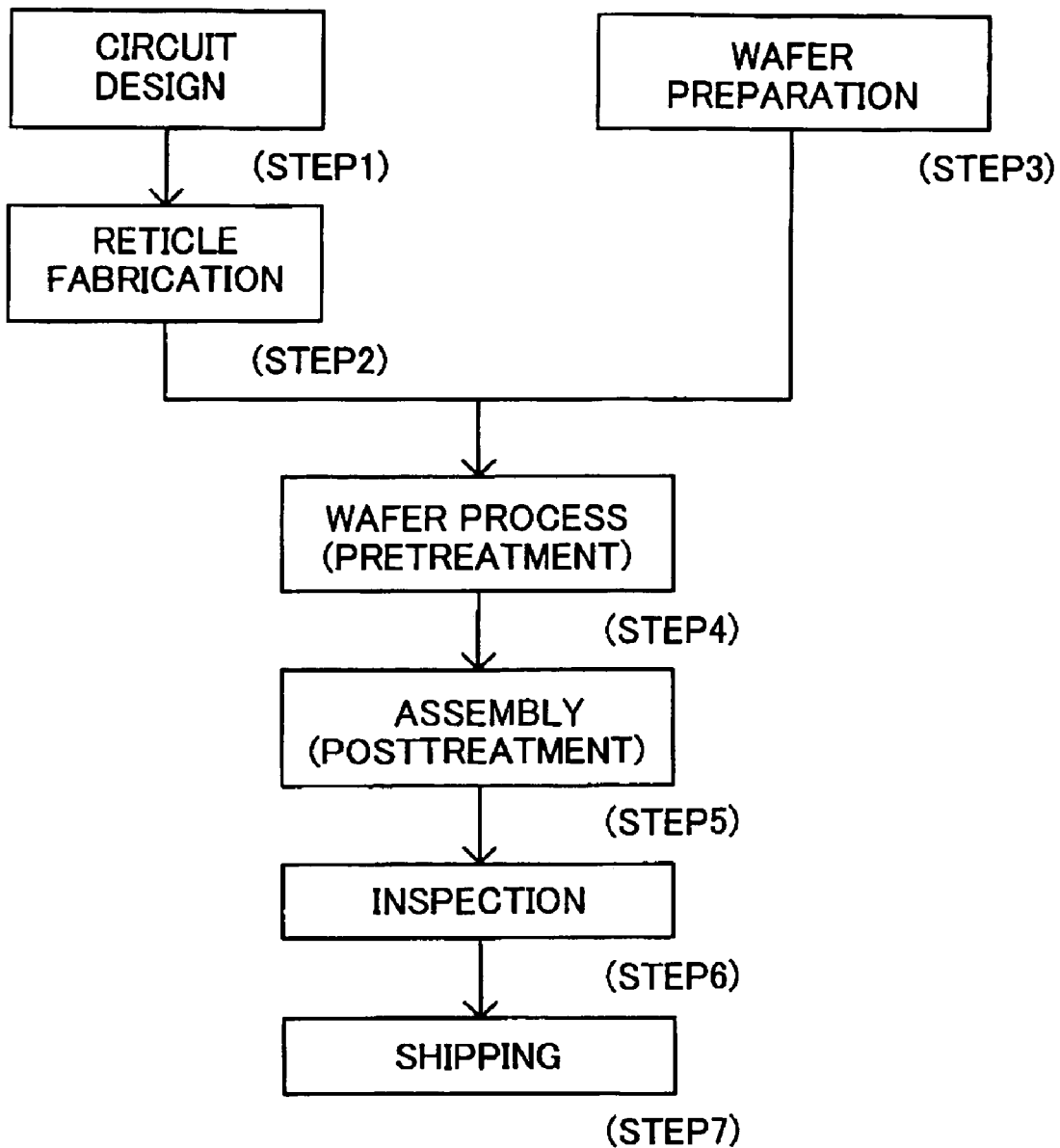
FIG. 13 is a flowchart showing a device manufacturing method using the exposure apparatus according to the first embodiment.
Figure 14:
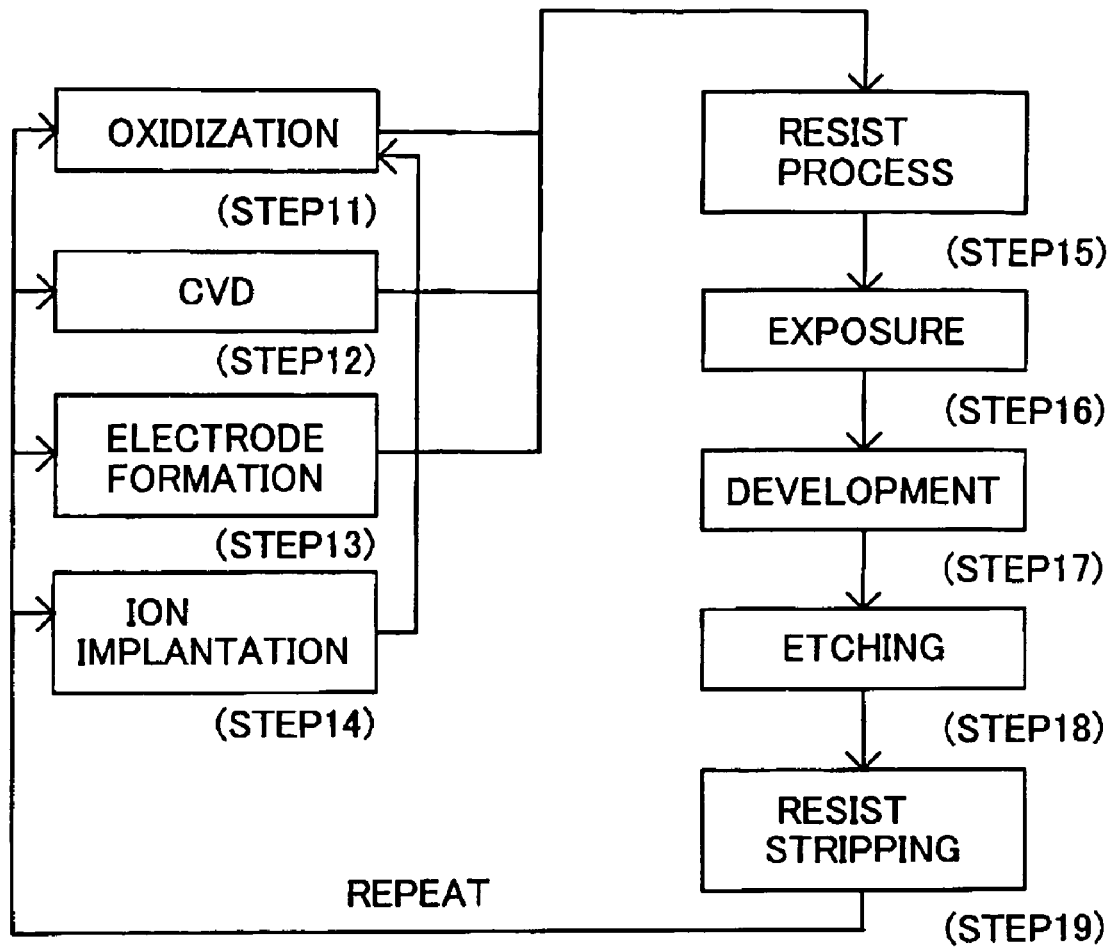
FIG. 14 is a flowchart showing a device manufacturing method using the exposure apparatus according to the first embodiment.

Referring now to FIGS. 13 and 14, a description will be given of an embodiment of a device manufacturing method using the above exposure apparatus 100. FIG. 13 is a flowchart for explaining how to fabricate devices (i.e., semiconductor chips such as IC and LSI, LCDs, CCDs, and the like). Here, a description will be given of the fabrication of a semiconductor chip as an example.

Step 1 (circuit design) designs a semiconductor device circuit. Step 2 (reticle fabrication) forms the reticle 101 having a designed circuit pattern. Step 13 (wafer preparation) manufactures the wafer 103 using materials such as silicon.

Step 4 (wafer process), which is also referred to as a pretreatment, forms the actual circuitry on the wafer 103 through lithography using the reticle 101 and wafer 103. Step 5 (assembly), which is also referred to as a post-treatment, forms into a semiconductor chip the wafer 103 formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 14 is a detailed flowchart of the wafer process in Step 4. Step 11 (oxidation) oxidizes the wafer 103's surface. Step 12 (CVD) forms an insulating layer on the wafer's surface. Step 13 (electrode formation) forms electrodes on the wafer 103 by vapor disposition and the like.

Step 14 (ion implantation) implants ions into the wafer 103. Step 15 (resist process) applies a photosensitive material onto the wafer 103. Step 16 (exposure) uses the exposure apparatus 100 to expose a circuit pattern of the reticle 101 onto the wafer 103. Step 17 (development) develops the exposed wafer 103. Step 18 (etching) etches parts other than a developed resist image. Step 19 (resist stripping) removes unused resist after etching. These steps are repeated to form multi-layer circuit patterns on the wafer 103.

Thus, the device manufacturing method using the exposure apparatus 100, and resultant devices constitute one aspect of the present invention.

Furthermore, the present invention is not limited to these preferred embodiments and various variations and modifications may be made without departing from the scope of the present invention.

TABLE 1

SPECIFICATION OF NUMERICAL EXAMPLE 1

| SURFACE NUMBER | SURFACE TYPE | EFFECTIVE DIAMETER [mm] | RADIUS OF CURVATURE [mm] | SURFACE INTERVAL [mm] | MATERIAL | BLOCK WEIGHT [g] |
|---|---|---|---|---|---|---|
| 0 | OBJECT PLANE | 106.8 | ∞ | 28.00000 | | |
| 1 | | 128.9 | 207.75668 | 23.63089 | SiO2 | 866.7 |
| 2 | | 129.9 | −504.15491 | 1.00000 | | |

TABLE 1-continued

SPECIFICATION OF NUMERICAL EXAMPLE 1

| SURFACE NUMBER | SURFACE TYPE | EFFECTIVE DIAMETER [mm] | RADIUS OF CURVATURE [mm] | SURFACE INTERVAL [mm] | MATERIAL | BLOCK WEIGHT [g] |
|---|---|---|---|---|---|---|
| 3 | | 130.2 | 155.36055 | 40.59806 | SiO2 | 2120.8 |
| 4 | | 116.3 | 101.43779 | 53.06695 | | |
| 5 | ASPHERIC SURFACE | 125.4 | −317.22767 | 11.25932 | SiO2 | 853.4 |
| 6 | | 131.3 | 332.10420 | 9.36961 | | |
| 7 | ASPHERIC SURFACE | 132.7 | 833.29169 | 11.00000 | SiO2 | 677.3 |
| 8 | | 140.3 | 782.50123 | 39.75016 | | |
| 9 | | 143.5 | −93.83519 | 18.88035 | SiO2 | 3872.0 |
| 10 | | 188.8 | −233.80384 | 1.00000 | | |
| 11 | | 223.4 | −4946.87316 | 45.50341 | SiO2 | 4869.8 |
| 12 | | 230.2 | −187.14453 | 1.00080 | | |
| 13 | | 260.8 | 1716.63779 | 40.22543 | SiO2 | 5455.5 |
| 14 | | 263.4 | −322.66926 | 1.00000 | | |
| 15 | | 266.4 | 552.96259 | 31.24448 | SiO2 | 4391.4 |
| 16 | | 265.5 | −1128.14368 | 1.22001 | | |
| 17 | | 246.1 | 187.30696 | 50.07615 | SiO2 | 6287.1 |
| 18 | | 240.4 | 2226.02672 | 1.25572 | | |
| 19 | | 187.7 | 124.71693 | 31.07373 | SiO2 | 4212.4 |
| 20 | | 161.7 | 131.97002 | 43.09554 | | |
| 21 | | 152.6 | −301.17355 | 11.00000 | SiO2 | 1840.6 |
| 22 | ASPHERIC SURFACE | 130.9 | 170.30961 | 0.80000 | | |
| 23 | PUPIL PLANE 1 | 135.6 | ∞ | 37.96093 | | |
| 24 | | 130.2 | −112.68840 | 11.00025 | SiO2 | 1576.5 |
| 25 | | 151.1 | −12000.62753 | 52.47081 | | |
| 26 | | 210.1 | −792.17285 | 33.80329 | SiO2 | 3804.9 |
| 27 | | 216.1 | −188.98345 | 1.00315 | | |
| 28 | | 236.2 | −3897.30074 | 37.49917 | SiO2 | 4430.8 |
| 29 | | 239.0 | −236.30006 | 1.00000 | | |
| 30 | | 238.7 | 345.62854 | 35.94614 | SiO2 | 4058.2 |
| 31 | | 236.9 | −903.33635 | 1.00000 | | |
| 32 | | 214.5 | 210.23331 | 26.25938 | SiO2 | 3376.9 |
| 33 | | 209.0 | 545.94790 | 1.00000 | | |
| 34 | | 179.7 | 127.14529 | 31.56352 | SiO2 | 2908.5 |
| 35 | | 170.4 | 294.95630 | 1.00000 | | |
| 36 | | 153.5 | 155.68393 | 11.08587 | SiO2 | 1898.2 |
| 37 | | 126.5 | 90.13712 | 24.13954 | | |
| 38 | ASPHERIC SURFACE | 123.7 | 303.80551 | 11.00000 | SiO2 | 1067.5 |
| 39 | | 100.6 | 74.24589 | 52.80501 | | |
| 40 | | 90.0 | −143.29720 | 11.00000 | SiO2 | 439.8 |
| 41 | | 89.7 | 243.98957 | 18.59603 | | |
| 42 | | 103.1 | 160.80477 | 16.13867 | SiO2 | 412.9 |
| 43 | | 104.7 | −2046.56668 | 4.86662 | | |
| 44 | INTERMEDIATE SURFACE | 106.7 | ∞ | −1.30000 | | |
| 45 | ASPHERIC SURFACE | 108.9 | 181.66811 | 11.00000 | SiO2 | 578.2 |
| 46 | | 109.3 | 158.31854 | 39.38249 | | |
| 47 | | 114.0 | −89.74242 | 35.66945 | SiO2 | 2683.7 |
| 48 | | 151.1 | −183.25922 | 1.00000 | | |
| 49 | | 158.9 | −268.16291 | 46.44997 | SiO2 | 4266.5 |
| 50 | | 190.9 | −166.51979 | 1.00003 | | |
| 51 | | 221.9 | 23046.07208 | 30.72337 | SiO2 | 3151.3 |
| 52 | | 226.0 | −284.29982 | 1.00000 | | |
| 53 | | 242.2 | 592.35284 | 32.95716 | SiO2 | 3870.3 |
| 54 | | 243.1 | −557.89384 | 1.00000 | | |
| 55 | | 240.4 | 278.46856 | 34.92436 | SiO2 | 4003.4 |
| 56 | | 237.8 | −12154.38708 | 1.00000 | | |
| 57 | | 217.2 | 200.47281 | 47.73195 | SiO2 | 5169.5 |
| 58 | | 197.4 | 623.90209 | 30.57233 | | |
| 59 | | 157.3 | 287.03834 | 26.22868 | SiO2 | 2012.7 |
| 60 | | 131.0 | 177.22467 | 19.32450 | | |
| 61 | | 128.9 | −441.96574 | 11.00006 | SiO2 | 1207.0 |
| 62 | | 113.1 | 103.29141 | 39.33492 | | |
| 63 | | 112.9 | −88.70118 | 11.00000 | SiO2 | 1509.0 |
| 64 | ASPHERIC SURFACE | 132.9 | 343.48725 | 34.22264 | | |
| 65 | ASPHERIC SURFACE | 135.8 | −105.20306 | 23.22559 | SiO2 | 3189.4 |
| 66 | ASPHERIC SURFACE | 178.7 | −197.23039 | 9.12030 | | |
| 67 | | 202.3 | −339.83884 | 47.24972 | SiO2 | 5916.0 |
| 68 | | 219.0 | −144.13322 | 1.12346 | | |
| 69 | | 254.0 | −580.99716 | 44.70707 | SiO2 | 7683.0 |
| 70 | | 259.5 | −189.11073 | −5.32095 | | |
| 71 | PUPIL PLANE 2 | 254.3 | ∞ | 7.00000 | | |
| 72 | | 273.0 | 1039.29687 | 37.26592 | SiO2 | 5448.9 |
| 73 | | 273.3 | −454.35645 | 1.02343 | | |
| 74 | | 259.2 | 288.18797 | 36.48763 | SiO2 | 4977.5 |
| 75 | | 255.7 | 6825.85027 | 1.00373 | | |

TABLE 1-continued

SPECIFICATION OF NUMERICAL EXAMPLE 1

| SURFACE NUMBER | SURFACE TYPE | EFFECTIVE DIAMETER [mm] | RADIUS OF CURVATURE [mm] | SURFACE INTERVAL [mm] | MATERIAL | BLOCK WEIGHT [g] |
|---|---|---|---|---|---|---|
| 76 | | 225.2 | 166.68277 | 42.33900 | SiO2 | 6188.5 |
| 77 | | 209.3 | 289.09116 | 1.00078 | | |
| 78 | | 184.4 | 116.29362 | 88.44031 | SiO2 | 6909.8 |
| 79 | ASPHERIC SURFACE | 103.5 | 83.28594 | 1.76867 | | |
| 80 | | 82.8 | 46.83589 | 49.71118 | CaF2 | 1112.9 |
| 81 | | 29.1 | ∞ | 1.00000 | water | |
| 82 | IMAGE PLANE | 26.7 | ∞ | 0.00000 | water | |
| TOTAL | | | | 1757.55674 | | 129298.6 |

TABLE 2

ASPHERIC COEFFICIENTS OF NUMERICAL EXAMPLE 1

| SURFACE NUMBER | k | FOURTH ORDER | SIXTH ORDER | EIGHTH ORDER | TENTH ORDER | TWELVETH ORDER | FOURTEENTH ORDER | SIXTEENTH ORDER |
|---|---|---|---|---|---|---|---|---|
| 5 | 2.00000 | 2.03287E−07 | −2.47408E−11 | 4.35304E−15 | −1.00980E−18 | 1.56807E−22 | −1.72192E−26 | 6.63124E−31 |
| 7 | −0.05730 | −2.32580E−07 | 2.09723E−11 | −3.72817E−15 | 6.83934E−19 | −9.82141E−23 | 9.76791E−27 | −3.23005E−31 |
| 22 | −1.09885 | 1.85232E−07 | −6.34357E−13 | −3.66783E−16 | −1.05495E−20 | −1.19873E−24 | 2.61396E−28 | 5.83832E−33 |
| 38 | −0.04119 | −2.08635E−07 | 4.41748E−12 | 1.43734E−15 | −1.32570E−19 | −2.77543E−24 | 9.69110E−28 | −3.74799E−32 |
| 45 | −1.97494 | −2.54646E−08 | −8.87760E−12 | 1.69837E−15 | −7.65544E−19 | 2.39670E−22 | −4.19154E−26 | 3.09958E−30 |
| 64 | −1.05975 | 3.36045E−08 | 5.10657E−12 | −5.53924E−16 | −7.11264E−20 | 1.71993E−24 | 1.37133E−27 | −9.55255E−32 |
| 66 | −1.25762 | 3.94006E−08 | −9.70881E−13 | −1.48560E−16 | 7.06010E−22 | 6.55724E−25 | −4.69448E−29 | 9.59519E−34 |
| 79 | −1.93399 | −1.81520E−07 | 2.71497E−11 | 1.11008E−14 | −3.52343E−18 | 4.79260E−22 | −2.90465E−26 | 5.97289E−32 |

TABLE 3

SPECIFICATION OF NUMERICAL EXAMPLE 2

| SURFACE NUMBER | SURFACE TYPE | EFFECTIVE DIAMETER [mm] | RADIUS OF CURVATURE [mm] | SURFACE INTERVAL [mm] | MATERIAL | BLOCK WEIGHT [g] |
|---|---|---|---|---|---|---|
| 0 | OBJECT PLANE | 106.8 | ∞ | 28.00000 | | |
| 1 | | 132.2 | 187.05739 | 24.15483 | SiO2 | 924.0 |
| 2 | | 133.0 | −508.04487 | 1.09453 | | |
| 3 | | 133.0 | 125.11492 | 23.81265 | SiO2 | 1831.5 |
| 4 | | 120.5 | 87.47722 | 50.57350 | | |
| 5 | ASPHERIC SURFACE | 129.2 | −335.10667 | 11.00049 | SiO2 | 830.1 |
| 6 | | 135.0 | 408.81730 | 11.18167 | | |
| 7 | ASPHERIC SURFACE | 138.1 | 1632.11901 | 11.01497 | SiO2 | 752.6 |
| 8 | | 145.5 | 720.80653 | 52.16600 | | |
| 9 | | 148.1 | −82.88952 | 22.35566 | SiO2 | 5935.1 |
| 10 | | 205.0 | −171.90509 | 1.00409 | | |
| 11 | | 237.8 | −437.71047 | 42.64435 | SiO2 | 7049.1 |
| 12 | | 247.2 | −173.83292 | 1.00000 | | |
| 13 | | 302.7 | 1268.67702 | 52.43200 | SiO2 | 9400.3 |
| 14 | | 306.1 | −346.19608 | 1.00000 | | |
| 15 | | 317.8 | 347.96054 | 61.57090 | SiO2 | 11806.1 |
| 16 | | 315.9 | −790.32551 | 1.00000 | | |
| 17 | | 266.5 | 190.68877 | 47.15627 | SiO2 | 8472.7 |
| 18 | | 258.5 | 583.88891 | 1.00000 | | |
| 19 | | 207.6 | 139.41366 | 40.66162 | SiO2 | 5933.6 |
| 20 | | 167.7 | 138.54944 | 39.99342 | | |
| 21 | | 163.5 | −354.31128 | 11.00000 | SiO2 | 2133.6 |
| 22 | ASPHERIC SURFACE | 137.5 | 177.51499 | 0.35000 | | |
| 23 | PUPIL PLANE 1 | 145.1 | ∞ | 41.61387 | | |
| 24 | | 136.6 | −112.83921 | 11.00000 | SiO2 | 2096.5 |
| 25 | | 160.0 | 761.52222 | 47.44751 | | |
| 26 | | 210.5 | −731.71829 | 35.65873 | SiO2 | 4125.9 |
| 27 | | 218.9 | −191.19365 | 1.00000 | | |
| 28 | | 241.3 | −1788.40621 | 44.55358 | SiO2 | 5697.1 |
| 29 | | 244.8 | −200.50679 | 1.00000 | | |
| 30 | | 242.1 | 325.77458 | 36.22160 | SiO2 | 4200.2 |
| 31 | | 240.0 | −1206.67658 | 1.00000 | | |
| 32 | | 213.7 | 178.92516 | 37.31009 | SiO2 | 3879.8 |
| 33 | | 207.2 | 1011.53858 | 1.00000 | | |

TABLE 3-continued

SPECIFICATION OF NUMERICAL EXAMPLE 2

| SURFACE NUMBER | SURFACE TYPE | EFFECTIVE DIAMETER [mm] | RADIUS OF CURVATURE [mm] | SURFACE INTERVAL [mm] | MATERIAL | BLOCK WEIGHT [g] |
|---|---|---|---|---|---|---|
| 34 | | 171.7 | 140.71217 | 35.07772 | SiO2 | 3568.8 |
| 35 | | 128.3 | 98.71139 | 24.55851 | | |
| 36 | ASPHERIC SURFACE | 125.2 | 500.35120 | 11.00000 | SiO2 | 993.0 |
| 37 | | 105.3 | 90.31116 | 74.42908 | | |
| 38 | | 88.4 | −106.89381 | 11.00000 | SiO2 | 507.4 |
| 39 | | 99.6 | 1425.60276 | 3.63000 | | |
| 40 | INTERMEDIATE SURFACE | 102.1 | ∞ | 12.05365 | | |
| 41 | ASPHERIC SURFACE | 120.2 | 217.35802 | 14.27236 | SiO2 | 519.4 |
| 42 | | 122.8 | 2641.60850 | 34.03077 | | |
| 43 | | 126.2 | −86.06148 | 31.51232 | SiO2 | 3078.8 |
| 44 | | 157.7 | −120.08390 | 1.03485 | | |
| 45 | | 182.5 | −437.93164 | 24.84119 | SiO2 | 2537.6 |
| 46 | | 189.5 | −179.42606 | 1.17130 | | |
| 47 | | 213.1 | 3929.98404 | 28.12757 | SiO2 | 2676.5 |
| 48 | | 216.7 | −319.48452 | 1.00000 | | |
| 49 | | 229.1 | 375.93196 | 32.31678 | SiO2 | 3390.1 |
| 50 | | 228.8 | −963.31002 | 1.00000 | | |
| 51 | | 222.1 | 224.17885 | 35.24770 | SiO2 | 3627.1 |
| 52 | | 218.4 | 3660.59060 | 1.00000 | | |
| 53 | | 197.0 | 188.47201 | 79.83337 | SiO2 | 7165.1 |
| 54 | | 135.0 | 169.20434 | 21.89664 | | |
| 55 | | 132.9 | −390.57143 | 11.00000 | SiO2 | 1326.5 |
| 56 | | 118.2 | 109.87802 | 47.75814 | | |
| 57 | | 118.2 | −76.59634 | 11.00000 | SiO2 | 2265.3 |
| 58 | ASPHERIC SURFACE | 152.5 | 599.27989 | 37.65496 | | |
| 59 | | 156.8 | −119.02806 | 18.70776 | SiO2 | 3774.9 |
| 60 | ASPHERIC SURFACE | 195.0 | −168.76663 | 5.68604 | | |
| 61 | | 199.7 | −177.53469 | 34.73694 | SiO2 | 5937.3 |
| 62 | | 213.4 | −126.75684 | 1.00000 | | |
| 63 | | 270.4 | −475.60328 | 64.42205 | SiO2 | 12470.6 |
| 64 | | 278.5 | −164.89791 | 10.00000 | | |
| 65 | PUPIL PLANE 2 | 287.2 | ∞ | −9.00000 | | |
| 66 | | 305.7 | 966.80240 | 44.15604 | SiO2 | 7979.0 |
| 67 | | 306.2 | −485.16619 | 1.00000 | | |
| 68 | | 290.8 | 319.82249 | 40.50825 | SiO2 | 6900.6 |
| 69 | | 287.2 | 6543.40161 | 1.00000 | | |
| 70 | | 247.6 | 167.52490 | 39.05662 | SiO2 | 7394.2 |
| 71 | | 240.8 | 331.65752 | 1.01768 | | |
| 72 | | 207.9 | 128.94244 | 99.99898 | SiO2 | 9757.5 |
| 73 | ASPHERIC SURFACE | 110.9 | 85.73074 | 1.00000 | | |
| 74 | | 87.7 | 48.91200 | 51.79041 | SiO2 | 888.3 |
| 75 | | 28.2 | ∞ | 0.50000 | water | |
| 76 | IMAGE PLANE | 26.7 | ∞ | 0.00000 | water | |
| TOTAL | | | | 1786.00001 | | 161826.2 |

TABLE 4

ASPHERIC COEFFICIENTS OF NUMERICAL EXAMPLE 2

| SURFACE NUMBER | k | FOURTH ORDER | SIXTH ORDER | EIGHTH ORDER | TENTH ORDER | TWELVETH ORDER | FOURTEENTH ORDER | SIXTEENTH ORDER |
|---|---|---|---|---|---|---|---|---|
| 5 | 1.17018 | 1.92848E−07 | −1.56985E−11 | 2.15809E−15 | −3.43013E−19 | 4.72129E−23 | −4.77920E−27 | 6.51988E−33 |
| 7 | −7.02027 | −1.61951E−07 | 1.56832E−11 | −1.63448E−15 | 2.10488E−19 | −1.45572E−23 | −2.97102E−28 | 2.32642E−31 |
| 22 | −1.50215 | 1.76453E−07 | −7.52307E−13 | −3.23240E−16 | −1.59007E−20 | 3.39717E−24 | −5.83667E−28 | 6.17505E−32 |
| 36 | −0.04294 | −1.90991E−07 | 5.76932E−12 | 9.35515E−16 | −1.04661E−19 | 2.24827E−24 | 5.52177E−28 | −6.41298E−32 |
| 41 | −0.25131 | −4.77560E−08 | −4.39569E−12 | 1.03849E−15 | −3.03329E−19 | 7.49231E−24 | −1.09235E−26 | 6.71155E−31 |
| 58 | 0.15845 | 3.28917E−08 | 2.46879E−12 | −2.95385E−16 | −1.20281E−19 | 2.11534E−23 | −1.35099E−27 | 3.21835E−32 |
| 60 | −0.84775 | 3.34892E−08 | −6.59109E−13 | −1.27994E−16 | −9.69136E−22 | 3.67938E−25 | −1.62668E−29 | −2.83916E−34 |
| 73 | −2.00199 | −1.84737E−07 | 3.14849E−11 | 8.90186E−15 | −3.33988E−18 | 5.36265E−22 | −4.47850E−26 | 1.43757E−30 |

TABLE 5

SPECIFICATION OF NUMERICAL EXAMPLE 1

| SURFACE NUMBER | SURFACE TYPE | EFFECTIVE DIAMETER [mm] | RADIUS OF CURVATURE [mm] | SURFACE INTERVAL [mm] | MATERIAL | BLOCK WEIGHT [g] |
|---|---|---|---|---|---|---|
| 0 | OBJECT PLANE | 106.8 | ∞ | 30.00000 | | |
| 1 | ASPHERIC SURFACE | 130.1 | 124.53474 | 28.04755 | SiO2 | 1019.0 |
| 2 | | 129.0 | −1298.63854 | 8.72494 | | |
| 3 | ASPHERIC SURFACE | 123.2 | 161.64699 | 33.18943 | SiO2 | 1399.7 |
| 4 | | 108.1 | 155.29192 | 12.22721 | | |
| 5 | | 103.6 | 165.25109 | 20.17556 | SiO2 | 785.1 |
| 6 | | 91.6 | 94.26328 | 42.18152 | | |
| 7 | | 89.0 | −69.57717 | 11.12604 | SiO2 | 868.5 |
| 8 | ASPHERIC SURFACE | 104.4 | 150.67323 | 15.68283 | | |
| 9 | | 112.2 | −841.16594 | 54.14055 | SiO2 | 2323.9 |
| 10 | | 142.0 | −175.91282 | 3.80962 | | |
| 11 | | 154.1 | −31361.23472 | 36.86337 | SiO2 | 1968.4 |
| 12 | | 161.0 | −172.97912 | 14.36346 | | |
| 13 | | 179.4 | 1329.33225 | 34.21976 | SiO2 | 2318.3 |
| 14 | | 182.4 | −213.56518 | 1.00000 | | |
| 15 | | 180.0 | 239.85332 | 34.30956 | SiO2 | 2265.4 |
| 16 | | 176.9 | −590.57671 | 1.00000 | | |
| 17 | | 160.3 | 192.16943 | 31.11250 | SiO2 | 1745.1 |
| 18 | ASPHERIC SURFACE | 149.3 | 790.11940 | −0.50000 | | |
| 19 | PUPIL PLANE 1 | 152.0 | ∞ | 15.62307 | | |
| 20 | | 145.0 | −268.45549 | 11.00000 | SiO2 | 1560.3 |
| 21 | | 130.0 | 167.25624 | 30.03242 | | |
| 22 | | 129.3 | −157.34781 | 11.00000 | SiO2 | 1515.4 |
| 23 | ASPHERIC SURFACE | 136.0 | 252.05231 | 58.41439 | | |
| 24 | | 138.7 | −77.47385 | 11.20278 | SiO2 | 2806.5 |
| 25 | | 153.8 | −88.09274 | 1.17481 | | |
| 26 | | 176.4 | −174.92016 | 27.71218 | SiO2 | 3708.6 |
| 27 | | 188.0 | −128.96675 | 1.00000 | | |
| 28 | | 222.9 | 373.13227 | 49.02914 | SiO2 | 4833.4 |
| 29 | | 224.1 | −284.52004 | 1.00000 | | |
| 30 | | 204.9 | 146.94195 | 51.91299 | SiO2 | 4311.0 |
| 31 | ASPHERIC SURFACE | 196.4 | −17865.24294 | 5.22717 | | |
| 32 | | 143.4 | 96.03500 | 26.12535 | SiO2 | 1989.1 |
| 33 | | 121.2 | 104.81649 | 42.39053 | | |
| 34 | | 80.2 | −880.93346 | 11.00000 | SiO2 | 304.7 |
| 35 | | 63.3 | 77.85399 | 14.06735 | | |
| 36 | INTERMEDIATE SURFACE | 68.3 | ∞ | 17.76090 | | |
| 37 | | 80.2 | −151.83903 | 25.00000 | SiO2 | 963.2 |
| 38 | | 109.4 | 265.77519 | 12.19141 | | |
| 39 | | 131.7 | 652.39484 | 19.55674 | SiO2 | 864.8 |
| 40 | ASPHERIC SURFACE | 142.3 | −296.76000 | 36.86561 | | |
| 41 | | 151.2 | −96.30493 | 38.39781 | SiO2 | 5442.2 |
| 42 | | 188.8 | −108.03198 | 1.00000 | | |
| 43 | ASPHERIC SURFACE | 249.3 | −1154.69619 | 72.08270 | SiO2 | 10697.4 |
| 44 | | 258.2 | −149.08783 | 2.23986 | | |
| 45 | | 259.1 | 195.51292 | 61.91665 | SiO2 | 8002.7 |
| 46 | | 253.5 | −2556.47343 | 1.18157 | | |
| 47 | | 210.7 | 171.90812 | 32.97603 | SiO2 | 4019.1 |
| 48 | | 199.6 | 413.16304 | 25.15479 | | |
| 49 | | 193.2 | −502.81149 | 11.00000 | SiO2 | 4080.6 |
| 50 | | 155.4 | 109.55174 | 77.01725 | | |
| 51 | | 153.2 | −137.56995 | 11.00000 | SiO2 | 3377.6 |
| 52 | ASPHERIC SURFACE | 174.3 | 194.48604 | 15.60573 | | |
| 53 | | 187.5 | 361.98961 | 11.10258 | SiO2 | 2144.9 |
| 54 | ASPHERIC SURFACE | 195.2 | 512.83087 | 22.84905 | | |
| 55 | | 202.8 | −1446.25940 | 31.23897 | SiO2 | 3185.0 |
| 56 | | 213.3 | −236.87410 | 1.00000 | | |
| 57 | | 235.6 | −916.87633 | 33.73653 | SiO2 | 4843.5 |
| 58 | | 243.5 | −249.72981 | 1.00000 | | |
| 59 | | 263.1 | −2075.78928 | 52.09758 | SiO2 | 7815.5 |
| 60 | | 268.2 | −219.70976 | −17.15000 | | |
| 61 | PUPIL PLANE 2 | 266.9 | ∞ | 32.15000 | | |
| 62 | | 271.2 | −415.06167 | 27.32565 | SiO2 | 7931.1 |
| 63 | | 284.8 | −1131.81852 | 10.37097 | | |
| 64 | | 301.3 | 467.79907 | 67.00000 | SiO2 | 11561.1 |
| 65 | | 301.0 | −579.33548 | 1.00000 | | |
| 66 | | 273.1 | 182.75899 | 69.00642 | SiO2 | 10034.1 |
| 67 | ASPHERIC SURFACE | 264.8 | −5185.24134 | 2.77722 | | |
| 68 | | 197.2 | 135.65743 | 49.04163 | SiO2 | 4280.0 |
| 69 | ASPHERIC SURFACE | 175.2 | 893.52582 | 12.$$6530 | | |

TABLE 5-continued

SPECIFICATION OF NUMERICAL EXAMPLE 1

| SURFACE NUMBER | SURFACE TYPE | EFFECTIVE DIAMETER [mm] | RADIUS OF CURVATURE [mm] | SURFACE INTERVAL [mm] | MATERIAL | BLOCK WEIGHT [g] |
|---|---|---|---|---|---|---|
| 70 | | 143.0 | 1041.21898 | 40.25597 | CaF2 | 2469.5 |
| 71 | | 84.1 | ∞ | 12.00000 | | |
| 72 | IMAGE PLANE | 26.7 | ∞ | 0.00000 | | |
| TOTAL | | | | 1700.00000 | | 127434.7 |

TABLE 6

ASPHERIC COEFFICIENTS OF NUMERICAL EXAMPLE 3

| SURFACE NUMBER | k | FOURTH ORDER | SIXTH ORDER | EIGHTH ORDER | TENTH ORDER | TWELVETH ORDER | FOURTEENTH ORDER | SIXTEENTH ORDER |
|---|---|---|---|---|---|---|---|---|
| 1 | 0.22478 | −6.14222E−08 | −2.18972E−12 | 1.28390E−16 | −2.68141E−20 | −3.96695E−24 | 1.95449E−27 | −2.00816E−31 |
| 3 | 0.95637 | 1.69290E−07 | −8.99069E−12 | 1.03760E−17 | −1.22673E−20 | −1.25805E−23 | −1.80014E−28 | 4.36291E−32 |
| 8 | 1.03570 | −5.69157E−07 | 1.14141E−10 | −2.28533E−14 | 5.86378E−18 | −1.77365E−21 | 3.60920E−25 | −3.04223E−29 |
| 18 | 2.00000 | −5.85926E−08 | −7.83774E−13 | 1.94221E−16 | 1.21549E−21 | −6.31434E−24 | 9.48915E−28 | −5.37338E−32 |
| 23 | −0.99920 | 2.04102E−07 | −7.49158E−12 | −1.20608E−15 | 5.08896E−20 | 2.15090E−23 | −3.10489E−21 | 1.44965E−31 |
| 31 | −1.98231 | 1.17720E−09 | 1.16525E−14 | 4.37406E−17 | −1.70146E−21 | −7.21071E−26 | 8.06980E−30 | −2.03075E−34 |
| 40 | 1.45514 | 1.42695E−07 | 4.07773E−12 | −4.81822E−16 | −1.60362E−20 | −2.15891E−23 | 5.30372E−27 | −3.51268E−31 |
| 43 | 0.70736 | −3.02351E−08 | 1.25711E−12 | −6.16158E−17 | 3.06014E−21 | −1.54576E−25 | 5.45009E−30 | −8.92126E−35 |
| 52 | −0.87189 | 4.57182E−09 | −1.02808E−14 | −6.51446E−16 | 1.05108E−19 | −1.17285E−23 | 7.58414E−28 | −1.96527E−32 |
| 54 | −0.74046 | 1.09554E−07 | −3.86383E−12 | −1.45218E−16 | 4.23111E−21 | 1.83529E−24 | −1.46930E−28 | 3.30799E−33 |
| 67 | 2.99998 | 6.06350E−09 | 4.46092E−13 | −1.88926E−17 | 3.73638E−22 | −1.30320E−26 | 7.22123E−31 | −1.32716E−35 |
| 69 | 0.27273 | 9.05060E−09 | 4.32611E−12 | −2.67412E−16 | 8.68926E−21 | 1.33528E−24 | −1.55951E−28 | 5.48455E−33 |

TABLE 7

SPECIFICATION OF PRIOR ART

| SURFACE NUMBER | SURFACE TYPE | EFFECTIVE DIAMETER [mm] | RADIUS OF CURVATURE [mm] | SURFACE INTERVAL [mm] | MATERIAL | BLOCK WEIGHT [g] |
|---|---|---|---|---|---|---|
| 0 | OBJECT PLANE | 106.8 | ∞ | 33.97941 | | |
| 1 | ASPHERIC SURFACE | 124.3 | −425.30949 | 12.00000 | SiO2 | 981.3 |
| 2 | | 135.6 | 290.11530 | 28.39804 | | |
| 3 | | 138.0 | −138.78576 | 69.47907 | SiO2 | 7652.2 |
| 4 | | 210.5 | −221.72783 | 1.00259 | | |
| 5 | ASPHERIC SURFACE | 220.6 | −615.15793 | 45.36367 | SiO2 | 8900.1 |
| 6 | | 265.2 | −341.99268 | 1.00038 | | |
| 7 | | 279.3 | −564.38054 | 56.08435 | SiO2 | 11799.0 |
| 8 | | 289.4 | −195.93544 | 24.38916 | | |
| 9 | | 324.6 | −649.83621 | 57.43377 | SiO2 | 16401.5 |
| 10 | | 333.2 | −256.77448 | 1.54150 | | |
| 11 | | 324.6 | 395.28944 | 66.18829 | SiO2 | 13194.8 |
| 12 | | 321.2 | −590.02914 | 1.00000 | | |
| 13 | | 242.0 | 168.54443 | 39.68779 | SiO2 | 7026.6 |
| 14 | | 228.3 | 313.65335 | 12.40649 | | |
| 15 | ASPHERIC SURFACE | 224.7 | 786.05803 | 12.07042 | SiO2 | 4953.9 |
| 16 | | 178.0 | 128.04990 | 24.34785 | | |
| 17 | ASPHERIC SURFACE | 176.1 | 408.82836 | 11.00000 | SiO2 | 1874.2 |
| 18 | | 163.3 | 200.17890 | 47.45031 | | |
| 19 | ASPHERIC SURFACE | 160.0 | −129.83807 | 10.00000 | SiO2 | 2799.2 |
| 20 | | 162.1 | 234.23042 | 51.74701 | | |
| 21 | ASPHERIC SURFACE | 168.2 | −179.11498 | 12.00000 | SiO2 | 4133.1 |
| 22 | | 206.9 | 566.57194 | 32.67912 | | |
| 23 | | 211.3 | −274.45105 | 48.40435 | SiO2 | 8432.5 |
| 24 | | 249.6 | −194.64477 | 1.00000 | | |
| 25 | | 285.5 | −460.16332 | 57.39131 | SiO2 | 13196.3 |
| 26 | | 293.7 | −184.10429 | 1.00000 | | |
| 27 | | 347.3 | 790.51614 | 46.93143 | SiO2 | 10878.8 |
| 28 | | 348.6 | −747.62631 | 1.00000 | | |
| 29 | | 349.9 | 355.95983 | 32.00000 | SiO2 | 12698.9 |
| 30 | | 346.8 | 688.95076 | 1.00000 | | |
| 31 | | 340.7 | 370.48010 | 40.44047 | SiO2 | 20840.0 |
| 32 | | 311.4 | 251.39051 | 102.73377 | | |
| 33 | PUPIL PLANE | 304.0 | ∞ | 13.00000 | | |

TABLE 7-continued

SPECIFICATION OF PRIOR ART

| SURFACE NUMBER | SURFACE TYPE | EFFECTIVE DIAMETER [mm] | RADIUS OF CURVATURE [mm] | SURFACE INTERVAL [mm] | MATERIAL | BLOCK WEIGHT [g] |
|---|---|---|---|---|---|---|
| 34 | | 311.3 | −234.21818 | 33.50303 | SiO2 | 20532.6 |
| 35 | | 340.9 | −378.04320 | 2.43101 | | |
| 36 | | 345.9 | −544.12350 | 35.10407 | SiO2 | 14777.9 |
| 37 | | 349.9 | −308.40880 | 1.00000 | | |
| 38 | | 350.2 | 374.40262 | 63.82833 | SiO2 | 14765.3 |
| 39 | | 347.8 | −1132.30483 | 1.00000 | | |
| 40 | ASPHERIC SURFACE | 319.5 | 435.88832 | 36.60813 | SiO2 | 8410.1 |
| 41 | | 312.2 | 2019.05538 | 1.00000 | | |
| 42 | | 249.8 | 150.71733 | 51.42916 | SiO2 | 8878.5 |
| 43 | | 238.9 | 336.64161 | 1.00000 | | |
| 44 | | 184.2 | 116.04478 | 51.92091 | SiO2 | 4631.8 |
| 45 | ASPHERIC SURFACE | 131.2 | 143.34311 | 7.41760 | | |
| 46 | | 123.1 | 183.21634 | 54.06278 | CaF2 | 2477.9 |
| 47 | | 29.1 | ∞ | 1.00000 | water | |
| 48 | IMAGE PLANE | 26.7 | ∞ | 0.00000 | water | |
| TOTAL | | | | 1337.45557 | | 220236.6 |

TABLE 8

ASPHERIC COEFFICIENTS OF PRIOR ART

| SURFACE NUMBER | k | FOURTH ORDER | SIXTH ORDER | EIGHTH ORDER | TENTH ORDER | TWELVETH ORDER | FOURTEENTH ORDER | SIXTEENTH ORDER |
|---|---|---|---|---|---|---|---|---|
| 1 | 1.97230 | 9.57968E−08 | −1.31041E−11 | 6.51210E−17 | −7.89688E−20 | 8.16437E−24 | −1.16925E−27 | 4.79454E−32 |
| 5 | −2.00000 | −6.98871E−08 | 5.21438E−13 | −2.45847E−17 | 1.11758E−21 | −5.99419E−26 | 3.23728E−30 | −6.20404E−35 |
| 15 | −1.98904 | 1.01068E−08 | 8.22019E−13 | −5.04802E−18 | −1.01507E−21 | 1.09816E−25 | −3.64331E−30 | 7.93601E−35 |
| 17 | −1.92128 | 9.02382E−08 | −1.58575E−12 | −5.66101E−11 | −2.17060E−21 | −5.83276E−25 | 1.40410E−29 | −4.53637E−33 |
| 19 | −1.39251 | −9.95732E−08 | 6.64150E−12 | 2.90181E−16 | −3.55777E−20 | −5.11516E−24 | 6.79573E−28 | −2.71384E−32 |
| 21 | 0.26605 | −7.58393E−08 | −1.66910E−12 | −4.31991E−17 | 4.27865E−21 | 1.83300E−24 | −7.12713E−29 | 2.52842E−32 |
| 40 | 1.85349 | 2.86226E−09 | −1.53725E−13 | −1.36307E−19 | −1.54604E−23 | 4.37506E−29 | 4.92675E−35 | −2.61697E−38 |
| 45 | 0.46648 | 4.80382E−09 | −4.49866E−12 | −4.79241E−17 | −2.19590E−20 | −6.07432E−26 | 2.81170E−28 | −2.59690E−32 |

This application claims a foreign priority benefit based on Japanese Patent Application No. 2004-335192, filed on Nov. 18, 2004, which is hereby incorporated by reference herein in its entirety as if fully set forth herein.

What is claimed is:

1. A projection optical system used for an exposure apparatus projecting a reduced size of an image of an object onto an image plane, said projection optical system comprising plural refractive elements,
wherein said projection optical system forms an intermediate image,
wherein only the plural refractive elements have optical powers in said projection optical system,
wherein said projection optical system has only one straight optical axis, and
wherein a maximum effective diameter of said projection optical system divided by an overall length of said projection optical system is equal to or smaller than 0.2.

2. A projection optical system according to claim 1, wherein said projection optical system has a numerical aperture of 1.1 or greater.

3. A projection optical system according to claim 1, wherein $-1.50 \leq \beta 1 \leq -0.50$, where $\beta 1$ is a magnification of a first imaging system for forming an intermediate image in said projection optical system.

4. A projection optical system according to claim 1, wherein said projection optical system is substantially telecentric both at object side and image side.

5. A projection optical system according to claim 1, wherein a distance between the image plane and an optical surface of said projection optical system closest to the image plane is 20 mm or smaller.

6. A projection optical system according to claim 1, wherein said projection optical system includes, in order from an object side to an image side, first, second, third and fourth units having optically positive powers, a first pupil being formed between the first and second units, the intermediate image being formed between the second and third units, and a second pupil being formed between the third and fourth units.

7. A projection optical system according to claim 6, wherein said projection optical system consists of the first, second, third and fourth units.

8. A projection optical system according to claim 6, wherein at least three of the first, second, third and fourth units include a negative lens.

9. A projection optical system according to claim 6, wherein each of the first, second, and third units includes a negative lens.

10. A projection optical system according to claim 6, wherein $f1 \geq f4$, $f2 \geq f4$, and $f3 \geq f4$ are met, where $f1$ denotes a focal length of the first unit, $f2$ denotes a focal length of the second unit, $f3$ denotes a focal length of the third unit, and $f4$ denotes a focal length of the fourth unit.

11. A projection optical system according to claim 6, wherein $0.04 \leq f1/L \leq 0.50$, $0.04 \leq f2/L \leq 0.50$, $0.04 \leq f3/$ L≦0.50, 0.01≦f4/L≦0.20 are met, where f1 denotes a focal length of the first unit, f2 denotes a focal length of the second unit, f3 denotes a focal length of the third unit, and f4 denotes a focal length of the fourth unit.

12. A projection optical system according to claim 1, further comprising a stop at a position corresponding to the intermediate image.

13. A projection optical system according to claim 6, further comprising a stop having a variable stop diameter at positions corresponding to the first and second pupils.

14. An exposure apparatus comprising:
   an illumination optical system for illuminating an original from light from a light source; and
   a projection optical system according to claim 1 for projecting a pattern of the original onto an object to be exposed.

15. A device manufacturing method comprising the steps of:
   exposing an object using an exposure apparatus according to claim 14; and
   developing the object that has been exposed.

16. A projection optical system used for an immersion exposure apparatus projecting a reduced size of an image of an object onto an image plane, said projection optical system comprising plural refractive elements, wherein:
   only the plural refractive elements have optical powers in said projection optical system,
   said projection optical system has only one straight optical axis,
   said projection optical system includes, in order from an object side to an image side, first, second, third and fourth units having optically positive powers, a first pupil being formed between the first and second units, an intermediate image surface being formed between the second and third units, and a second pupil being formed between the third and fourth units,
   a field stop is provided on or near the intermediate image surface and an iris stop is provided on or near the second pupil,
   the first, second and third units include a negative lens,
   each of the negative lens is arranged at a boundary between adjacent units that include the negative lens, and
   a maximum effective diameter of said projection optical system divided by an overall length of said projection optical system is equal to or smaller than 0.2.

* * * * *